US012733158B2

(12) United States Patent
Kim et al.

(10) Patent No.: US 12,733,158 B2
(45) Date of Patent: Sep. 8, 2026

(54) SEMICONDUCTOR MEMORY DEVICE

(71) Applicant: Samsung Electronics Co., Ltd., Suwon-si (KR)

(72) Inventors: Kang In Kim, Suwon-si (KR); Kyoung Hwan Kim, Suwon-si (KR); Young Woo Son, Suwon-Si (KR); Sang-Bin Ahn, Suwon-si (KR); Sang Min Lee, Suwon-si (KR); Young-Seung Cho, Suwon-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 555 days.

(21) Appl. No.: 18/350,323

(22) Filed: Jul. 11, 2023

(65) Prior Publication Data

US 2024/0237334 A1 Jul. 11, 2024

(30) Foreign Application Priority Data

Jan. 9, 2023 (KR) ........................ 10-2023-0002709

(51) Int. Cl.
*H10B 12/00* (2023.01)

(52) U.S. Cl.
CPC ........... *H10B 12/50* (2023.02); *H10B 12/315* (2023.02)

(58) Field of Classification Search
CPC .. H10B 12/00; H10B 12/0383; H10B 12/053; H10B 12/31; H10B 12/315; H10B 12/34;
(Continued)

(56) References Cited

U.S. PATENT DOCUMENTS 8,030,158 B2 10/2011 Kang et al.
8,900,968 B2 12/2014 Kishida
(Continued)

FOREIGN PATENT DOCUMENTS

KR 20090044490 A 5/2009
KR 20140113254 A 9/2014
(Continued)

OTHER PUBLICATIONS

European Search Report corresponding to European Patent Application No. 23208072.1 (4 pages) (dated May 7, 2024).

*Primary Examiner* — Brook Kebede
(74) *Attorney, Agent, or Firm* — Wolf, Greenfield & Sacks, P.C.

(57) ABSTRACT

A semiconductor memory device with improved performance and reliability is provided. The semiconductor memory device includes a substrate having a cell region and a peripheral region, a cell region isolation layer that separates the cell region from the peripheral region, and a plurality of cell gate structures, each including a cell gate electrode that extends in a first direction. The cell region includes a plurality of active areas that extend in a second direction different from the first direction, and are between a respective cell element isolation layer and the cell region isolation layer. Each of the active areas includes a first portion and a second portion separated by the cell gate structure, the second portion of the active area is on both sides of a respective one of the first portion of the active area. The active areas includes a normal active area and a dummy active area.

20 Claims, 28 Drawing Sheets

(58) Field of Classification Search
CPC .... H10B 12/36; H10B 12/482; H10B 12/488; H10B 12/50; G11C 5/025; G11C 8/14; G11C 11/404
See application file for complete search history.

(56) References Cited

U.S. PATENT DOCUMENTS

| | | | | |
|---|---|---|---|---|
| 9,385,112 | B1 | 7/2016 | Takesako | |
| 9,508,723 | B2 | 11/2016 | Lee et al. | |
| 9,553,098 | B2 | 1/2017 | You et al. | |
| 2014/0346580 | A1 | 11/2014 | Lee | |
| 2019/0139963 | A1 | 5/2019 | Hong et al. | |
| 2021/0098460 | A1* | 4/2021 | Lee | H10B 12/315 |
| 2021/0126098 | A1* | 4/2021 | Lee | H10B 12/488 |
| 2021/0304803 | A1 | 9/2021 | Kwon | |
| 2022/0139927 | A1* | 5/2022 | Chang | H10B 12/315 257/296 |

FOREIGN PATENT DOCUMENTS

| | | | |
|---|---|---|---|
| TW | 202238959 | A | 10/2022 |
| TW | 202247428 | A | 12/2022 |

* cited by examiner

SEMICONDUCTOR MEMORY DEVICE

CROSS-REFERENCE TO RELATED APPLICATION

This application claims priority from Korean Patent Application No. 10-2023-0002709 filed on Jan. 9, 2023 in the Korean Intellectual Property Office, and all the benefits accruing therefrom under 35 U.S.C. 119, the contents of which in its entirety are herein incorporated by reference.

BACKGROUND

The present disclosure relates to a semiconductor memory device.

As a semiconductor device becomes more highly integrated, individual circuit patterns have become more miniaturized to realize more semiconductor devices within the same area. That is, as the integration density of a semiconductor device increases, the design rule for components of the semiconductor device decreases.

In a highly scaled semiconductor device, a process of forming a plurality of wiring lines and a plurality of buried contacts (BC) interposed therebetween has become increasingly complicated and difficult.

SUMMARY

Aspects of the present disclosure provide a semiconductor memory device capable of improving reliability and performance.

However, aspects of the present disclosure are not restricted to the one set forth herein. The above and other aspects of the present disclosure will become more apparent to one of ordinary skill in the art to which the present disclosure pertains by referencing the detailed description of the present disclosure given below.

According to some embodiments of the present disclosure, a semiconductor memory device includes a substrate including a cell region and a peripheral region, a cell region isolation layer that separates the cell region from the peripheral region, and a plurality of cell gate structures on the cell region of the substrate, each of the plurality of cell gate structures including a cell gate electrode that extends in a first direction. The cell region of the substrate includes a plurality of active areas that extend in a second direction different from the first direction. The active areas are between a respective cell element isolation layer and the cell region isolation layer. Each of the active areas includes a first portion and a second portion separated by one of the cell gate structures. The second portion of a respective one of the active areas is on both sides of a respective one of the first portion of the active areas. Ones of the plurality of active areas are in a normal active area or a dummy active area. A width of a first portion of the dummy active area in the first direction is greater than a width of a first portion of the normal active area in the first direction. The cell gate structure includes a head region at an end of the cell gate structure and a body region that extends from the head region in the first direction. A width of the head region of the cell gate structure in a third direction perpendicular to the first direction increases from an end of the head region to a middle portion of the head region and the width of the head region decreases from the middle portion of the head region to the body region of the cell gate structure. At least a portion of the head region of the cell gate structure overlaps the respective one of the active areas and the cell element isolation layer in a direction perpendicular to the substrate.

According to some embodiments of the present disclosure, a semiconductor memory device includes a substrate including a cell region and a peripheral region, a cell region isolation layer that separates the cell region from the peripheral region, a plurality of cell gate structures on the cell region of the substrate, each of the plurality of cell gate structures including a cell gate electrode that extends in a first direction, and a cell gate plug on the cell gate electrode and electrically connected to the cell gate electrode. The cell region of the substrate includes a plurality of active areas that extend in a second direction different from the first direction. The active areas are between a respective cell element isolation layer and the cell region isolation layer. Ones of the plurality of active areas are in a normal active area or a dummy active area that is in contact with the cell region isolation layer. The cell gate structure includes a first head region and a second head region at opposite ends of the cell gate structure, and a body region between the first head region and the second head region. The body region extends in the first direction, and a width of the first head region of the cell gate structure in a third direction perpendicular to the first direction increases from an end of the first head region opposite the body region to a middle portion of the head region and the width of the first head region decreases from the middle portion of the head region to the body region of the cell gate structure. The first head region of the cell gate structure completely overlaps the active area and the cell element isolation layer in a direction perpendicular to the substrate. The cell gate structure includes a first cell gate structure and a second cell gate structure. The cell gate plug is electrically connected to the cell gate electrode in a first head region of the first cell gate structure. The cell gate plug is spaced apart from the cell gate electrode in a first head region of the second cell gate structure.

According to some embodiments of the present disclosure, a semiconductor memory device includes a substrate including a cell region and a peripheral region, a cell region isolation layer that separates the cell region from the peripheral region, and a plurality of cell gate structures on the cell region of the substrate, each of the plurality of cell gate structures including a cell gate electrode that extends in a first direction. The cell region of the substrate includes a plurality of active areas that extend in a second direction different from the first direction. The active areas are between a respective cell element isolation layer and the cell region isolation layer. The plurality of active areas includes a normal active area and a dummy active area in contact with the cell region isolation layer. The cell gate structure includes a head region at an end of the cell gate structure and a body region extending from the head region in the first direction. A width of the head region of the cell gate structure in a third direction perpendicular to the first direction increases from an end of the head region to a middle portion of the head region and the width of the head region decreases from the middle portion of the head region to the body region of the cell gate structure. At least a portion of the head region of the cell gate structure overlaps the active area and the cell element isolation layer in a direction perpendicular to the substrate. A width of the dummy active area in the first direction in a region overlapping the cell gate electrode is greater than a width of the normal active area in the first direction in a region overlapping the cell gate electrode.

BRIEF DESCRIPTION OF THE DRAWINGS

The above and other aspects and features of the present disclosure will become more apparent by describing in detail example embodiments thereof with reference to the attached drawings, in which.

DETAILED DESCRIPTION

Although the terms first, second, etc. may be used herein to describe various elements or components, these elements or components should not be limited by these terms. These terms are used to distinguish one element or component from another element or component. Thus, a first element or component discussed below could be termed a second element or component without departing from the teachings of the present disclosure.

Figure 1:
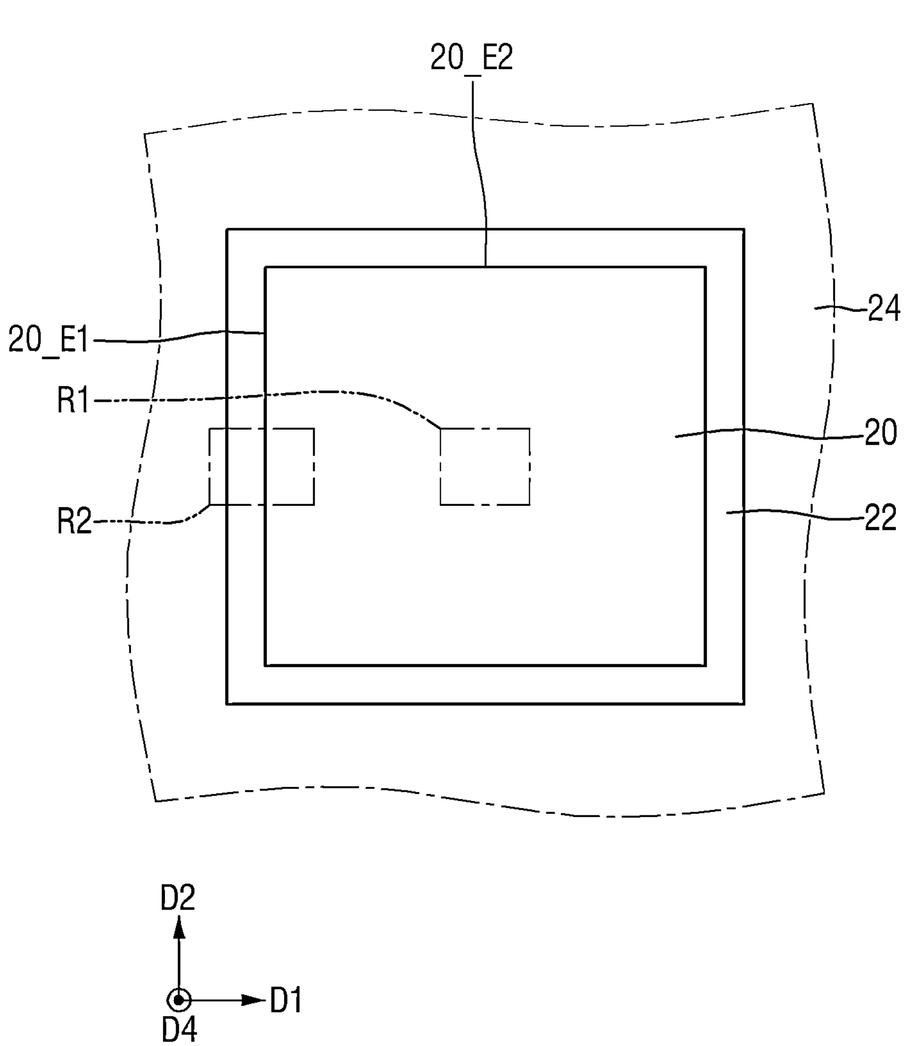
FIG. 1 is a schematic layout diagram illustrating a semiconductor memory device according to some embodiments.
Figure 2:
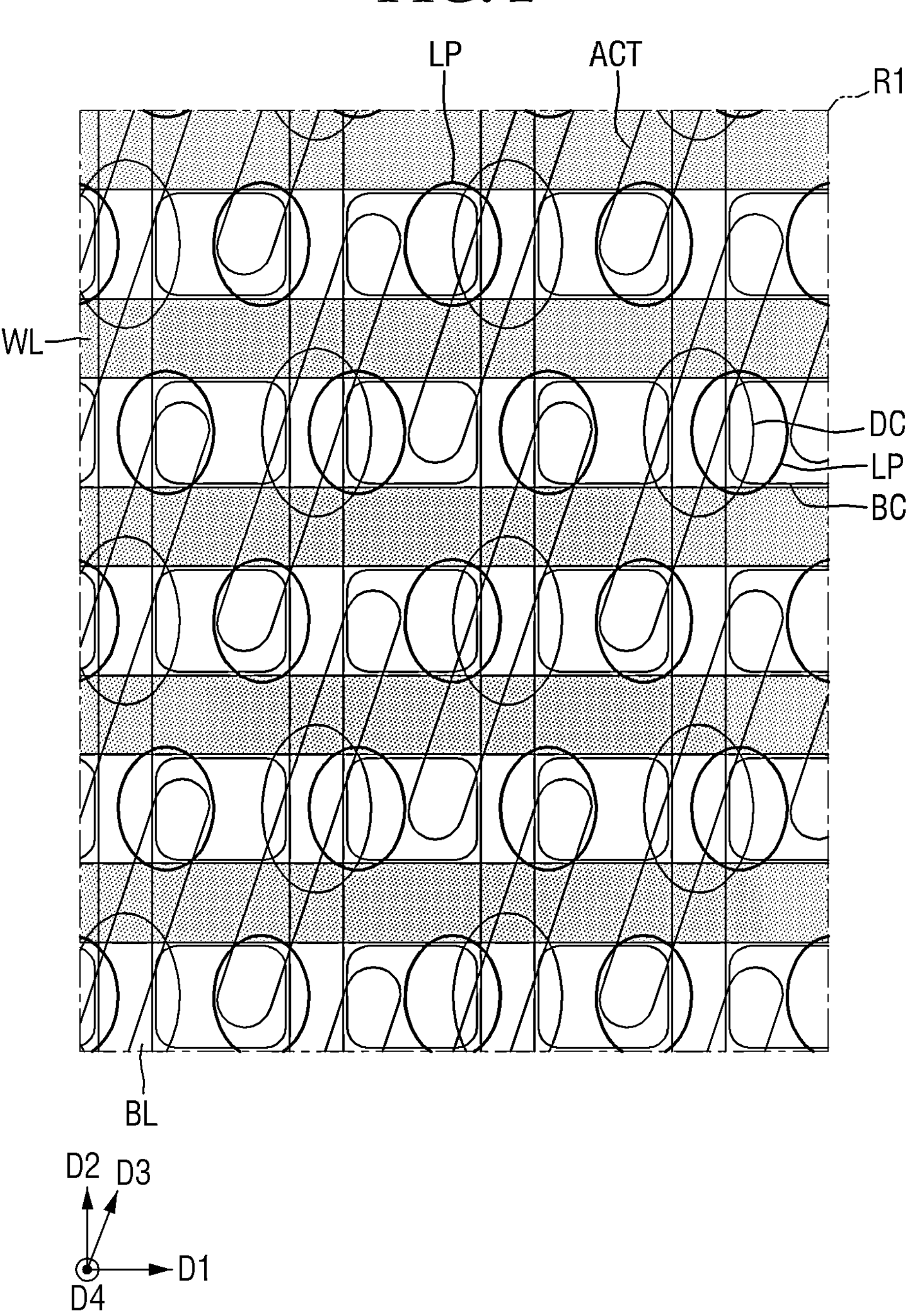
FIG. 2 shows a layout of region R1 of FIG. 1.
Figure 3:
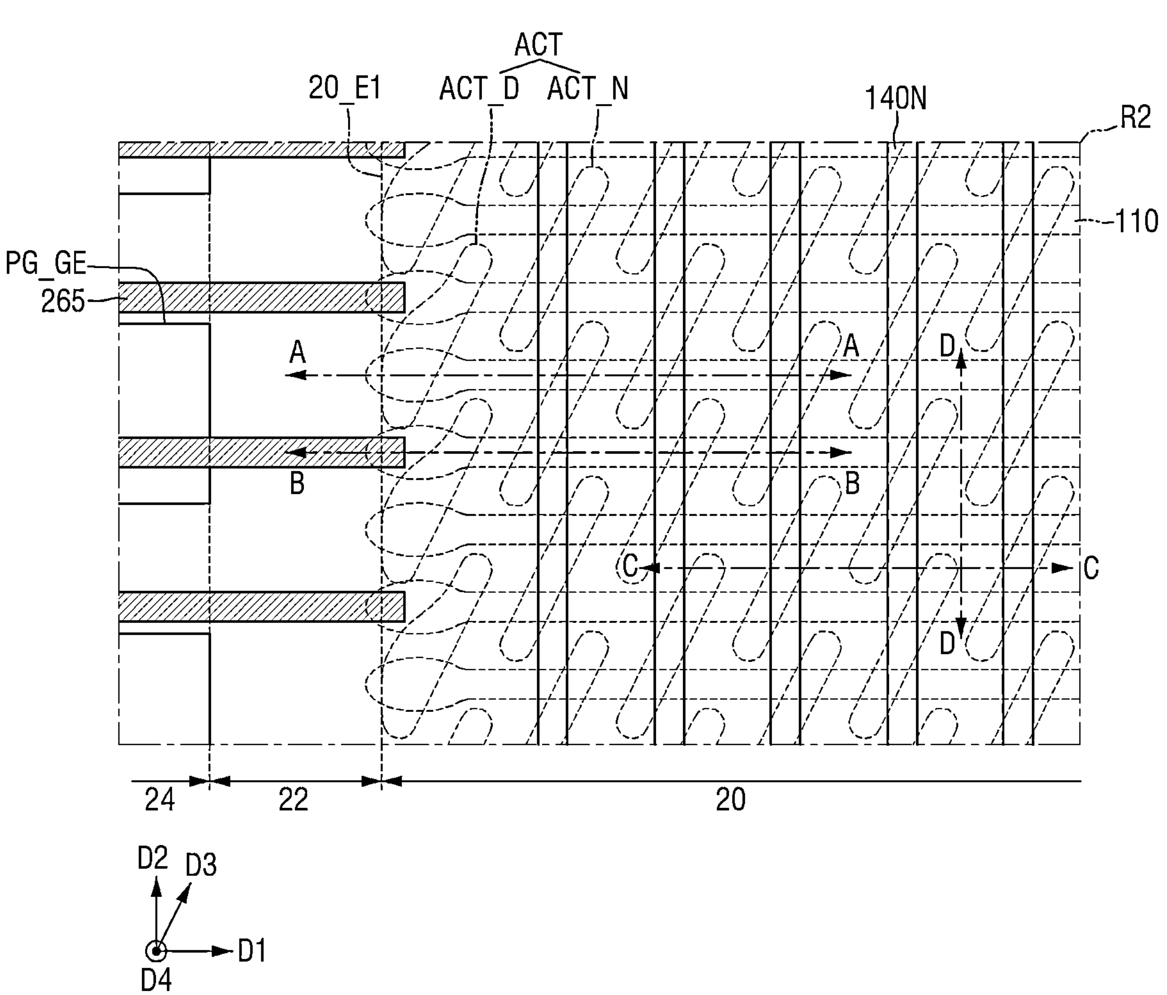
FIG. 3 is a plan view of region R2 of FIG. 1.
Figure 4:
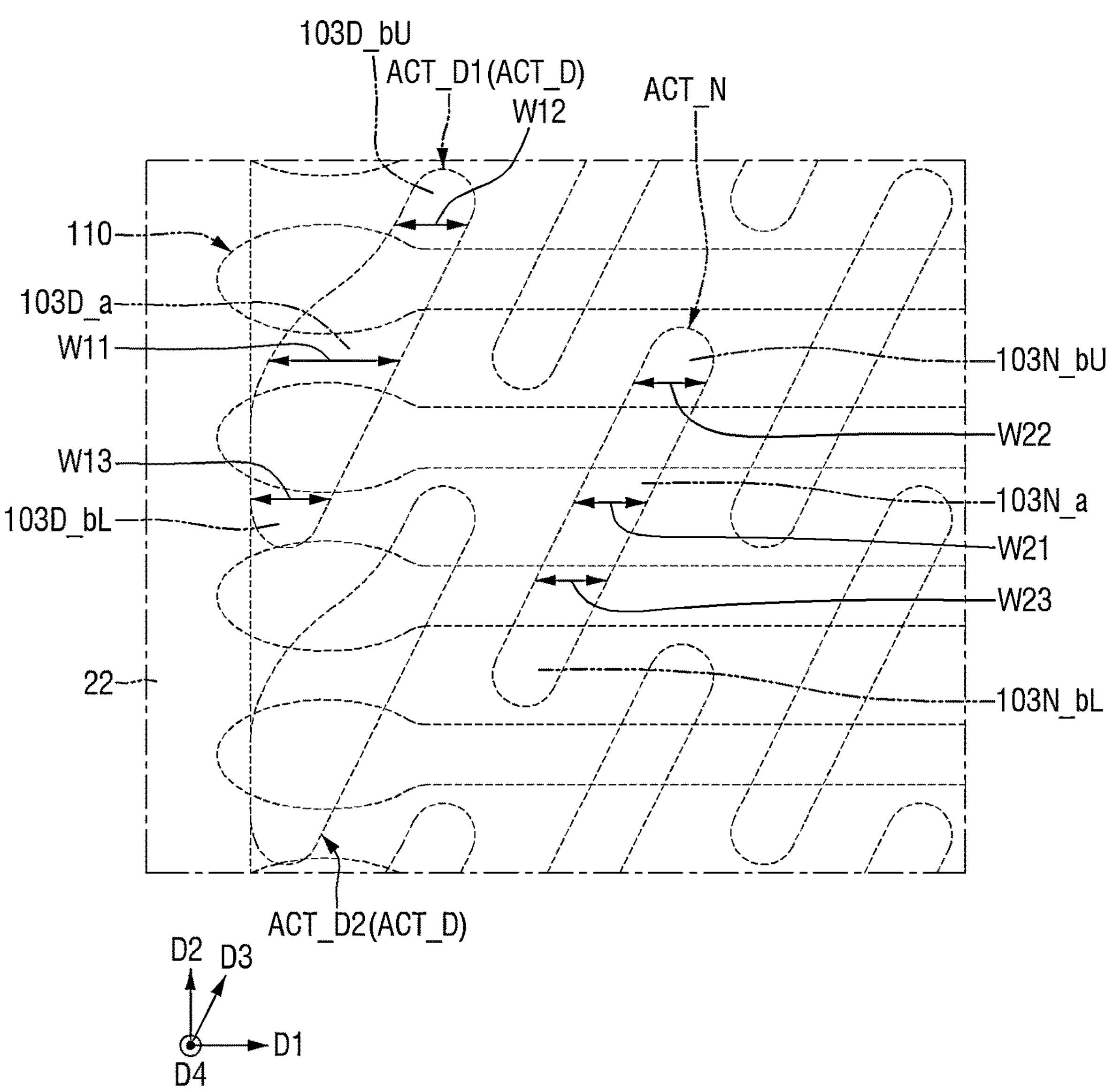
FIG. 4 is a plan view illustrating a cell gate structure and an active area in a partial region of FIG. 3.
Figure 5:
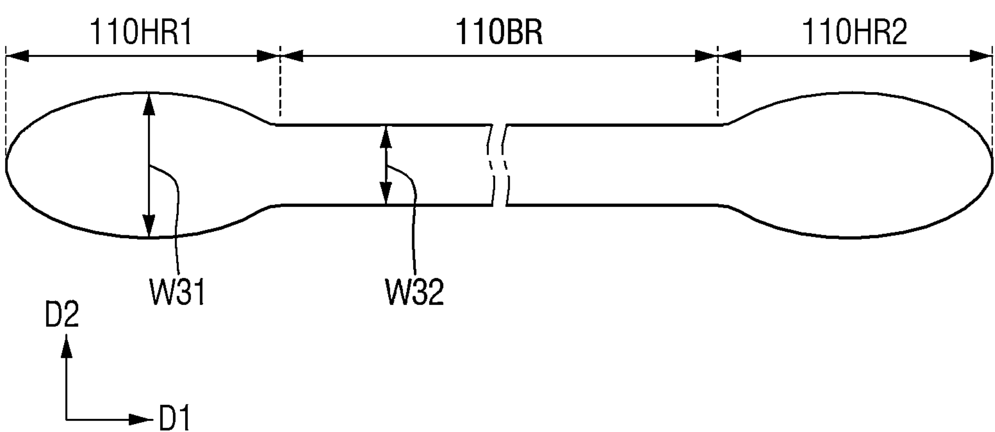
FIG. 5 is a diagram illustrating the shape of the cell gate structure of FIG. 3.

FIG. 1 is a schematic layout diagram illustrating a semiconductor memory device according to some embodiments. FIG. 2 shows a layout of region R1 of FIG. 1. FIG. 3 is a plan view of region R2 of FIG. 1. FIG. 4 is a plan view illustrating a cell gate structure and an active area in a partial region of FIG. 3. FIG. 5 is a diagram illustrating the shape of the cell gate structure of FIG. 3. FIGS. 6 to 9 are cross-sectional views taken along lines A-A, B-B, C-C and D-D of FIG. 3. FIGS. 10 to 13 are enlarged views of regions P and Q of FIG. 6.

In the drawings of the semiconductor memory device according to some embodiments, a dynamic random access memory (DRAM) is illustrated as an example, but the present disclosure is not limited thereto.

Referring to FIGS. 1 to 3, the semiconductor memory device according to some embodiments may include a cell region 20, a cell region isolation layer 22, and a peripheral region 24.

The cell region isolation layer 22 may be formed along the perimeter of the cell region 20. The cell region isolation layer 22 may separate the cell region 20 from the peripheral region 24. The cell region 20 may be defined by the cell region isolation layer 22. The peripheral region 24 may be defined around the cell region 20.

The cell region 20 may include a first boundary surface 20_E1 extending in a second direction D2 and a second boundary surface 20_E2 extending in a first direction D1. The first boundary surface 20_E1 and the second boundary surface 20_E2 of the cell region are a boundary between the cell region 20 and the cell region isolation layer 22.

The cell region 20 may include a plurality of cell active areas ACT. The cell active area ACT may be defined by a cell element isolation layer 105 (see FIGS. 6 to 9) formed in a substrate 100 (see FIGS. 6 to 9). As the design rule of the semiconductor memory device is reduced, the cell active area ACT may be disposed in a bar shape of a diagonal line or an oblique line in plan view as illustrated. For example, the cell active area ACT may extend in a third direction D3.

A plurality of gate electrodes extending in the first direction D1 may be disposed across the cell active area ACT. The plurality of gate electrodes may extend in parallel to each other. The plurality of gate electrodes may be, for example, a plurality of word lines WL. The word lines WL may be arranged at equal intervals. The width of the word line WL or the interval between the word lines WL may be determined according to the design rule. A conductive line included in a cell gate structure 110 may be a word line WL.

For example, the word line WL may extend to the cell region isolation layer 22. A part of the word line WL may overlap the cell region isolation layer 22 in a fourth direction D4. As another example, the word line WL may be disposed in the cell region 20. The word line WL may not extend to the cell region isolation layer 22. The entire word line WL may overlap the cell region 20 in the fourth direction D4.

Each cell active area ACT may be divided into three portions by the two word lines WL extending in the first direction D1. The shape of the cell active area ACT will be described later.

On the word lines WL, a plurality of bit lines BL extending in a second direction D2 perpendicular to the word lines WL may be disposed, as shown in FIG. 2. The plurality of bit lines BL may extend in parallel to each other. The bit lines BL may be arranged at equal intervals. The width of the bit line BL or the interval between the bit lines BL may be determined according to the design rule.

The bit line BL may extend to the cell region isolation layer 22. A part of the bit line BL may overlap the cell region isolation layer 22 in the fourth direction D4. The fourth direction D4 may be orthogonal to the first direction D1, the second direction D2, and the third direction D3. The fourth direction D4 may be a thickness direction of the substrate 100.

A normal cell conductive line 140N may be included in the bit line BL. Although not shown, a dummy cell conductive line 140D (see FIG. 20) may also be included in the bit line BL.

A peri-gate structure PG_GE may be disposed in the peripheral region 24. A stacked structure of the peri-gate structure PG_GE will be described later with reference to FIGS. 25 and 26.

The semiconductor memory device according to some embodiments may include various contact arrangements formed on the cell active area ACT. Various contact arrangements may include, for example, direct contacts (DC), buried contacts (BC), landing pads (LP), and the like.

Here, a direct contact DC may mean a contact that electrically connects the cell active area ACT to the bit line BL. The buried contact BC may refer to a contact that connects the cell active area ACT to a lower electrode 191 (see FIGS. 8 and 9) of a capacitor. Due to the disposition structure, a contact area between the buried contact BC and the cell active area ACT may be small. Accordingly, in order to increase the contact area with the cell active area ACT and to increase the contact area with the lower electrode 191 (see FIGS. 8 and 9), a conductive landing pad LP may be introduced.

The landing pad LP may be disposed between the cell active area ACT and the buried contact BC, or may be disposed between the buried contact BC and the lower electrode 191 (see FIGS. 6 and 9) of the capacitor. In the semiconductor memory device according to some embodiments, the landing pad LP may be disposed between the buried contact BC and the lower electrode of the capacitor. By expanding the contact area through the introduction of the landing pad LP, the contact resistance between the cell active area ACT and the lower electrode of the capacitor can be reduced.

The direct contact DC may be disposed in a central portion of the active area ACT. The buried contacts BC may be disposed at both ends of the active area ACT. As the buried contacts BC are disposed at both ends of the cell active area ACT, the landing pads LP may be disposed adjacent to both ends of the cell active area ACT to partially overlap the buried contacts BC. In other words, the buried contacts BC may be formed to overlap the cell element isolation layer 105 (see FIG. 6) and the cell active areas ACT between the adjacent word lines WL and between the adjacent bit lines BL.

The word lines WL may be formed to be buried in the substrate 100. The word lines WL may be disposed across the cell active areas ACT between the direct contacts DC or the buried contacts BC. As illustrated, two word lines WL may be disposed to traverse one cell active area ACT. As the cell active area ACT extends along the third direction D3, the word line WL may have an angle of less than 90 degrees with respect to the cell active area ACT.

The direct contacts DC and the buried contacts BC may be arranged symmetrically. Accordingly, the direct contacts DC and the buried contacts BC may be disposed in a straight line along the first direction D1 and the second direction D2.

On the other hand, unlike the direct contacts DC and the buried contacts BC, the landing pads LP may be arranged in a zigzag shape in the second direction D2 in which the bit line BL extends. Further, the landing pads LP may be disposed to overlap the same side surface of each bit line BL in the first direction D1 in which the word line WL extends.

For example, each of the landing pads LP in a first line may overlap a left side surface of the corresponding bit line BL, and each of the landing pads LP in a second line may overlap a right side surface of the corresponding bit line BL.

Referring to FIGS. 1 to 13, the semiconductor memory device according to some embodiments may include the cell active area ACT, a plurality of cell gate structures 110, a plurality of normal cell conductive lines 140N, a plurality of storage pads 160, and a data storage patterns DSP.

The substrate 100 may include the cell region 20, the cell region isolation layer 22, and the peripheral region 24. The substrate 100 may be a silicon substrate or silicon-on-insulator (SOI) substrate. In some embodiments, the substrate 100 may include silicon germanium, silicon germanium on insulator (SGOI), indium antimonide, a lead tellurium compound, indium arsenide, indium phosphide, gallium arsenide, or gallium antimonide, but is not limited thereto.

The plurality of cell gate structures 110, a plurality of bit line structures 140ST, the plurality of storage pads 160, and the data storage patterns DSP may be disposed in the cell region 20.

The cell element isolation layer 105 may be formed in the substrate 100 of the cell region 20. The cell element isolation layer 105 may have a shallow trench isolation (STI) structure having excellent element isolation characteristics. The cell element isolation layer 105 may define the cell active area ACT in the cell region 20. The cell active area ACT defined by the cell element isolation layer 105 may have a long island shape having a short axis and a long axis, as shown in FIGS. 2 to 5.

The cell active area ACT may have an oblique shape to have an angle of less than 90 degrees with respect to the word line WL disposed in the cell element isolation layer 105. The cell active area ACT may have an oblique shape to have an angle of less than 90 degrees with respect to the bit line BL formed on the cell element isolation layer 105. In other words, the cell active area ACT may have an oblique shape to have an angle of less than 90 degrees with respect to the cell gate structure 110 disposed in the cell element isolation layer 105. The cell active area ACT may have an oblique shape to have an angle of less than 90 degrees with respect to the bit line structure 140ST formed on the cell element isolation layer 105.

The cell region isolation layer 22 may have an STI structure. The depth from the upper surface of the cell region isolation layer 22 to the lowermost part of the cell region isolation layer 22 may be different from the depth from the upper surface of the cell region isolation layer 22 to the lowermost part of the cell element isolation layer 105. For example, the depth from the upper surface of the cell region isolation layer 22 to the lowermost part of the cell region isolation layer 22 may be greater than the depth from the upper surface of the cell region isolation layer 22 to the lowermost part of the cell element isolation layer 105.

Each of the cell element isolation layer 105 and the cell region isolation layer 22 may include, for example, at least one of a silicon oxide layer, a silicon nitride layer, or a silicon oxynitride layer, but is not limited thereto. In FIGS. 6 to 9, the cell element isolation layer 105 and the cell region isolation layer 22 are each illustrated as being formed of a single insulating layer, but this is merely for simplicity of description, and they are not limited thereto. Depending on the widths of the cell element isolation layer 105 and the cell region isolation layer 22, the cell element isolation layer 105 and the cell region isolation layer 22 may each be formed of a single insulating layer or a plurality of insulating layers.

Figure 8:
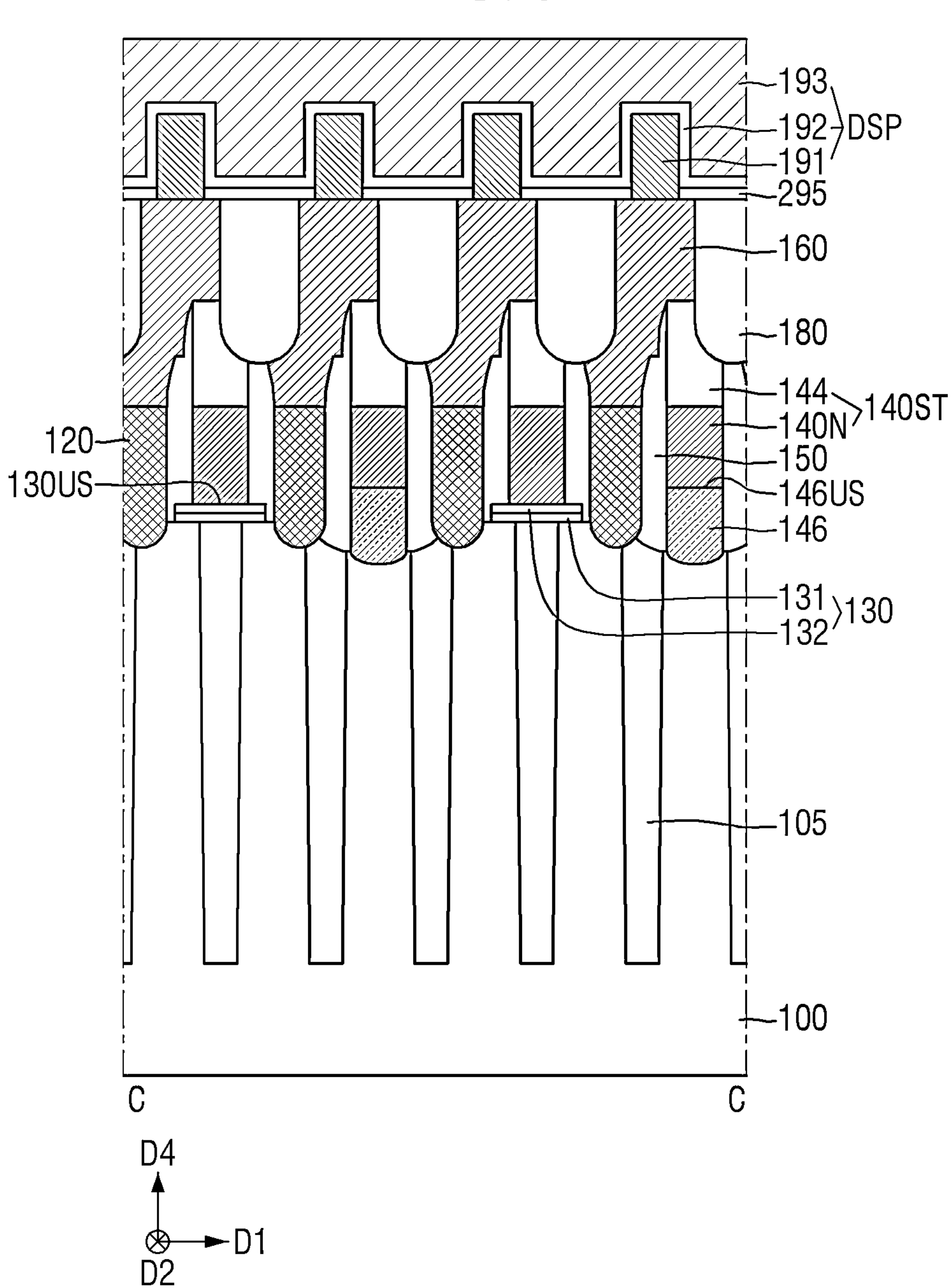
Figure 9:
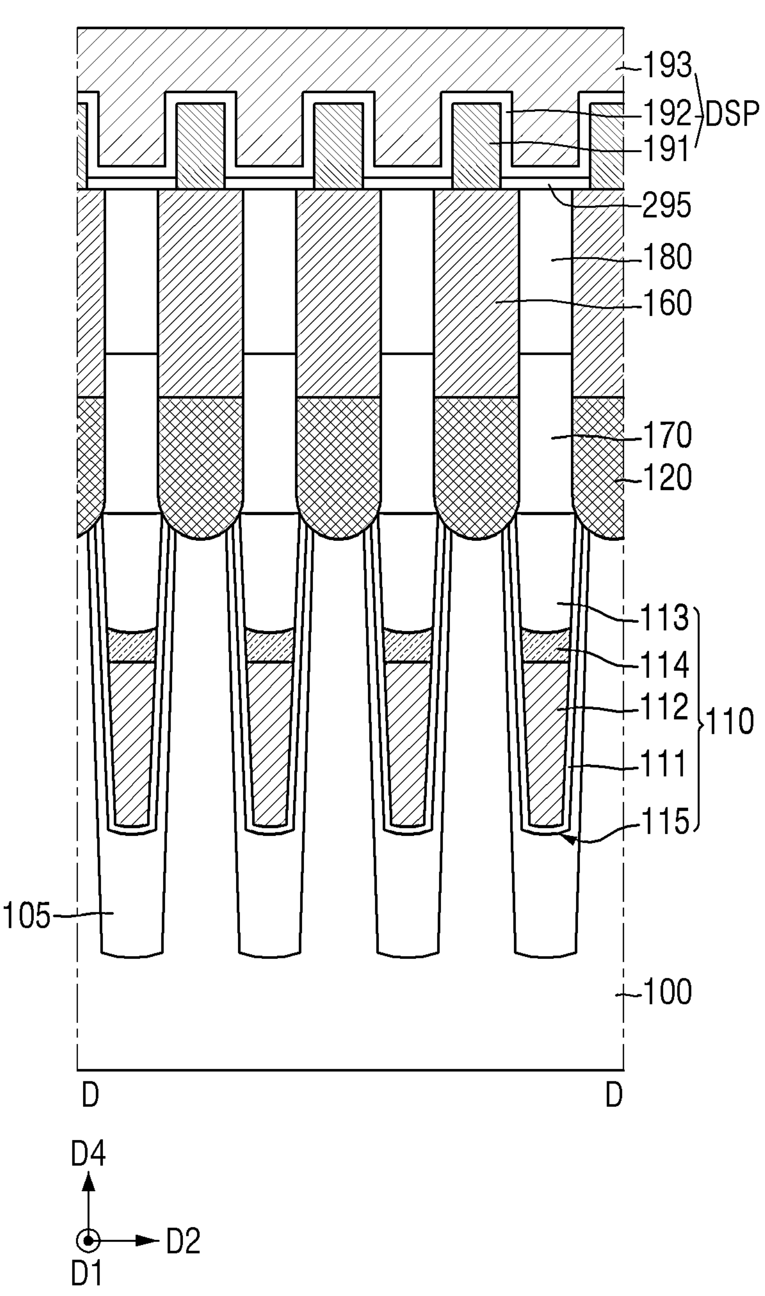

In FIGS. 8 and 9, it is shown that the upper surface of the cell element isolation layer 105 and the upper surface of the substrate 100 lie on the same plane. However, this is merely for simplicity of description, and the present disclosure is not limited thereto.

The plurality of cell active areas ACT may include a plurality of normal cell active areas ACT_N and a plurality of dummy cell active areas ACT_D. The normal cell active area ACT_N may have a bar shape extending in the third direction D3. The dummy cell active area ACT_D may extend in the third direction D3. The dummy cell active area ACT_D may have a bowling pin shape which is not constricted in the middle. The dummy cell active area ACT_D may have an asymmetrical shape with respect to an imaginary line extending in the third direction D3.

The plurality of dummy cell active areas ACT_D may be disposed at the outermost part among the plurality of cell active areas ACT. The plurality of dummy cell active areas ACT_D may be disposed along the boundary of the cell region 20. For example, the plurality of dummy cell active areas ACT_D may be disposed along the first boundary surface 20_E1 of the cell region, as illustrated in FIG. 3.

For example, the dummy cell active area ACT_D that are along the first boundary surface 20_E1 of the cell region may be in contact with the cell region isolation layer 22. The dummy cell active area ACT_D may include a first dummy cell active area ACT_D1 and a second dummy cell active area ACT_D2 that are closest to one another in the second direction D2, as illustrated in FIG. 4. The first dummy cell active area ACT_D1 and the second dummy cell active area ACT_D2 may be in contact with the cell region isolation layer 22. Since the dummy cell active area ACT_D is in contact with the cell region isolation layer 22, the dummy cell active area ACT_D may be defined by the cell element isolation layer 105 and the cell region isolation layer 22.

In plan view, the first dummy cell active area ACT_D1 and the second dummy cell active area ACT_D2 are not connected to each other. The first dummy cell active area ACT_D1 and the second dummy cell active area ACT_D2 may be spatially separated from each other by the cell element isolation layer 105 and the cell region isolation layer 22.

The plurality of normal cell active areas ACT_N may be disposed between the dummy cell active areas ACT_D disposed along the first boundary surface 20_E1. The normal cell active area ACT_N may not be in contact with the cell region isolation layer 22. The normal cell active area ACT_N may be defined by the cell element isolation layer 105.

The plurality of cell gate structures 110 may be formed in the substrate 100 and the cell element isolation layer 105. The cell gate structures 110 may be formed across the cell element isolation layer 105 and the cell active areas ACT defined by the cell element isolation layer 105.

As shown in FIG. 9, the cell gate structure 110 may include a cell gate trench 115 disposed in the substrate 100 and in the cell element isolation layer 105. The cell gate structure 110 may include a cell gate insulating layer 111, a cell gate electrode 112, a cell gate capping pattern 113, and a cell gate capping conductive layer 114. Here, the cell gate electrode 112 may correspond to the word line WL. Unlike the illustrated example of FIG. 9, the cell gate structure 110 may not include the cell gate capping conductive layer 114, in some embodiments.

The cell gate trench 115 may be relatively deep in the cell element isolation layer 105 and relatively shallow in the cell active areas ACT. The bottom surface of the cell gate electrode 112 may be curved. That is, the depth of the cell gate trench 115 in the cell element isolation layer 105 may be greater than the depth of the cell gate trench 115 in the cell active area ACT.

In FIGS. 3 and 5, the cell gate structure 110 may include a first head region 110HR1, a second head region 110HR2, and a body region 110BR. The first head region 110HR1 of the cell gate structure and the second head region 110HR2 of the cell gate structure may be positioned at the ends of the cell gate structure 110. The first head region 110HR1 of the cell gate structure and the second head region 110HR2 of the cell gate structure are spaced apart from each other in the first direction D1.

The body region 110BR of the cell gate structure is disposed between the first head region 110HR1 of the cell gate structure and the second head region 110HR2 of the cell gate structure. The body region 110BR of the cell gate structure extends in the first direction D1. The body region 110BR of the cell gate structure extends from the head regions 110HR1 and 110HR2 of the cell gate structure in the first direction D1.

The first head region 110HR1 of the cell gate structure and the second head region 110HR2 of the cell gate structure may each have a balloon shape extending in the first direction D1. In the first head region 110HR1 and the second head region 110HR2 of the cell gate structure, the width of the cell gate structure 110 in the second direction D2 may increase and then decrease as the distance from the body region 110BR of the cell gate structure increases. A maximum width W32 of the cell gate structure 110 in the second direction D2 in the body region 110BR of the cell gate structure is smaller than a maximum width W31 of the cell gate structure 110 in the second direction D2 in the head regions 110HR1 and 110HR2 of the cell gate structure.

At least a part of the head regions 110HR1 and 110HR2 of the cell gate structure may be disposed in the cell region 20. At least a part of the head regions 110HR1 and 110HR2 of the cell gate structure may overlap the cell element isolation layer 105 and the cell active area ACT in the fourth direction D4.

In the semiconductor memory device according to some embodiments, a part of the head regions 110HR1 and 110HR2 of the cell gate structure may be disposed in the cell region 20, and the rest of the head regions 110HR1 and 110HR2 of the cell gate structure may be disposed in the cell region isolation layer 22. A part of the head regions 110HR1 and 110HR2 of the cell gate structure may overlap the cell element isolation layer 105 and the cell active area ACT in the fourth direction D4. For example, a part of the head regions 110HR1 and 110HR2 of the cell gate structure may overlap the dummy cell active area ACT_D in the fourth direction D4. The rest of the head regions 110HR1 and 110HR2 of the cell gate structure may overlap the cell region isolation layer 22 in the fourth direction D4.

The cell gate insulating layer 111 may extend along the sidewall and bottom surface of the cell gate trench 115. The cell gate insulating layer 111 may extend along the profile of at least a part of the cell gate trench 115.

The cell gate insulating layer 111 may include, for example, at least one of silicon oxide, silicon nitride, silicon oxynitride, or a high-k material having a higher dielectric constant than silicon oxide. The high-k material may include, for example, at least one selected from the group consisting of hafnium oxide, hafnium silicon oxide, hafnium aluminum oxide, lanthanum oxide, lanthanum aluminum oxide, zirconium oxide, zirconium silicon oxide, tantalum oxide, titanium oxide, barium strontium titanium oxide, barium titanium oxide, strontium titanium oxide, yttrium oxide, aluminum oxide, lead scandium tantalum oxide, lead zinc niobate, and/or a combination thereof.

The cell gate electrode 112 may be disposed on the cell gate insulating layer 111. The cell gate electrode 112 may fill or at least partially fill a part of the cell gate trench 115. The cell gate capping conductive layer 114 may extend along the upper surface of the cell gate electrode 112.

The cell gate electrode 112 may include a conductive material, and may include, for example, at least one of doped polysilicon, conductive metal nitride, conductive metal silicon nitride, metal carbonitride, conductive metal silicide, conductive metal oxide, a two-dimensional material, metal or a metal alloy. The cell gate capping conductive layer 114 may include, for example, polysilicon or polysilicon-germanium, but is not limited thereto.

The cell gate capping pattern 113 may be disposed on the cell gate electrode 112 and the cell gate capping conductive layer 114. The cell gate capping pattern 113 may fill or at least partially fill the cell gate trench 115 remaining after the cell gate electrode 112 and the cell gate capping conductive layer 114 are formed. The cell gate insulating layer 111 is illustrated in some embodiments as extending along the sidewall of the cell gate capping pattern 113, but is not limited thereto.

Figure 14:
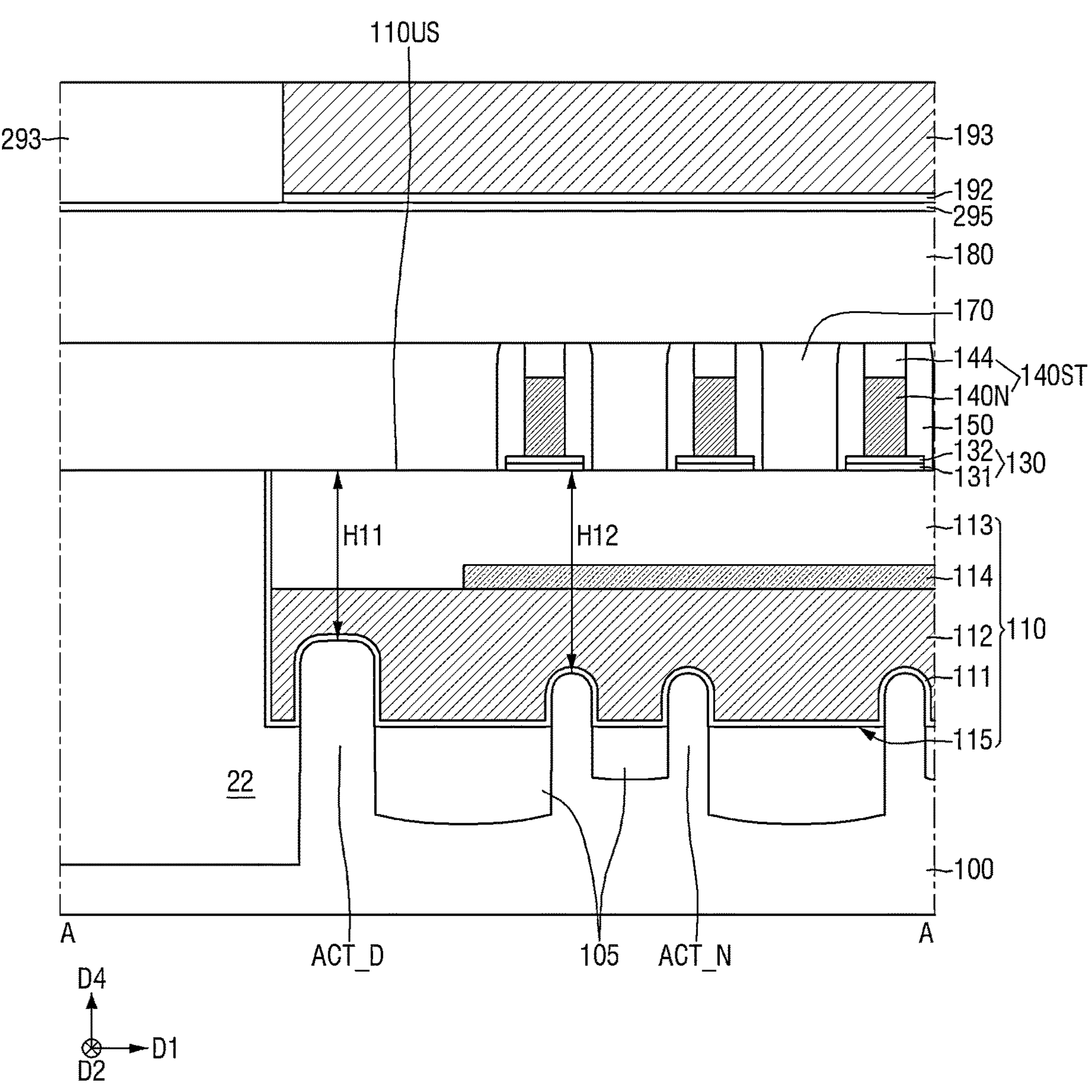
FIGS. 14 to 16 are diagrams each illustrating a semiconductor memory device according to some embodiments.

The cell gate capping pattern 113 includes an upper surface 110US of the cell gate structure, as shown in FIG. 14. The upper surface of the cell gate capping pattern 113 may be the upper surface 110US of the cell gate structure. The cell gate capping pattern 113 may include, for example, at least one of silicon nitride (SiN), silicon oxynitride (SiON), silicon oxide ($SiO_2$), silicon carbonitride (SiCN), silicon oxycarbonitride (SiOCN), or a combination thereof.

Although not shown, an impurity doped region may be formed on at least one side of the cell gate structure 110. The impurity doped region may be a source/drain region of a transistor. The cell gate capping pattern 113 may be in contact with the cell gate electrode 112 in the vicinity of the dummy cell active area ACT_D.

Each cell active area ACT may be divided into three portions by two cell gate structures 110 extending in the first direction D1. For example, one cell active area ACT may include a first portion and a second portion separated from each other by two cell gate structures 110. The first portion of the cell active area ACT may be positioned in the center of the cell active area ACT. The second portion of the cell active area ACT may be positioned at the end of the cell active area ACT. The second portion of the cell active area ACT may be defined on both sides of the first portion of the cell active area ACT.

The normal cell active area ACT_N may include a first portion 103N_a of the normal cell active area, a second upper portion 103N_bU of the normal cell active area, and a second lower portion 103N_bL of the normal cell active area, as shown in FIG. 4. The first portion 103N_a of the normal cell active area may be positioned in the center of the normal cell active area ACT_N. The second upper portion 103N_bU of the normal cell active area and the second lower portion 103N_bL of the normal cell active area may be positioned at the ends of the normal cell active area ACT_N, respectively. The first portion 103N_a of the normal cell active area is defined between the second upper portion 103N_bU of the normal cell active area and the second lower portion 103N_bL of the normal cell active area.

The dummy cell active area ACT_D may include a first portion 103D_a of the dummy cell active area, a second upper portion 103D_bU of the dummy cell active area, and a second lower portion 103D_bL of the dummy cell active area. The first portion 103D_a of the dummy cell active area may be positioned in the center of the dummy cell active area ACT_D. The second upper portion 103D_bU of the dummy cell active area and the second lower portion 103D_bL of the dummy cell active area may be positioned at the ends of the dummy cell active area ACT_D, respectively. The first portion 103D_a of the dummy cell active area is defined between the second upper portion 103D_bU of the dummy cell active area and the second lower portion 103D_bL of the dummy cell active area.

A position of the first portion 103D_a of the dummy cell active area may correspond to a position of the first portion 103N_a of the normal cell active area. A position of the second upper portion 103D_bU of the dummy cell active area may correspond to a position of the second upper portion 103N_bU of the normal cell active area. A position of the second lower portion 103D_bL of the dummy cell active area may correspond to a position of the second lower portion 103N_bL of the normal cell active area.

For example, the first portion 103N_a of the normal cell active area may be connected to the bit line BL. The second upper portion 103N_bU of the normal cell active area and the second lower portion 103N_bL of the normal cell active area may be connected to the data storage patterns DSP.

In plan view, a width W11 of the first portion 103D_a of the dummy cell active area in the first direction D1 is greater than a width W12 of the second upper portion 103D_bU of the dummy cell active area in the first direction D1. The width W11 of the first portion 103D_a of the dummy cell active area in the first direction D1 is greater than a width W13 of the second lower portion 103D_bL of the dummy cell active area in the first direction D1.

The width W12 of the second upper portion 103D_bU of the dummy cell active area in the first direction D1 may be different from the width W13 of the second lower portion 103D_bL of the dummy cell active area in the first direction D1. For example, the width W13 of the second lower portion 103D_bL of the dummy cell active area in the first direction D1 may be greater than the width W12 of the second upper portion 103D_bU of the dummy cell active area in the first direction D1. Here, the width W12 of the second upper portion 103D_bU of the dummy cell active area and the width W13 of the second lower portion 103D_bL of the dummy cell active area may be measured at positions spaced apart from the cell gate structure 110 by the same distance.

The width W11 of the first portion 103D_a of the dummy cell active area is greater than a width W21 of the first portion 103N_a of the normal cell active area in the first direction D1. The width W12 of the second upper portion 103D_bU of the dummy cell active area may be greater than or equal to a width W22 of the second upper portion 103N_bU of the normal cell active area in the first direction D1. The width W13 of the second lower portion 103D_bL of the dummy cell active area is greater than a width W23 of the second lower portion 103N_bL of the normal cell active area in the first direction D1.

The width of the dummy cell active area ACT_D in the first direction D1 at a portion where the dummy cell active area ACT_D intersects the cell gate electrode 112 may be greater than the width of the normal cell active area ACT_N in the first direction D1 at a portion where the normal cell active area ACT_N intersects the cell gate electrode 112.

Figure 6:
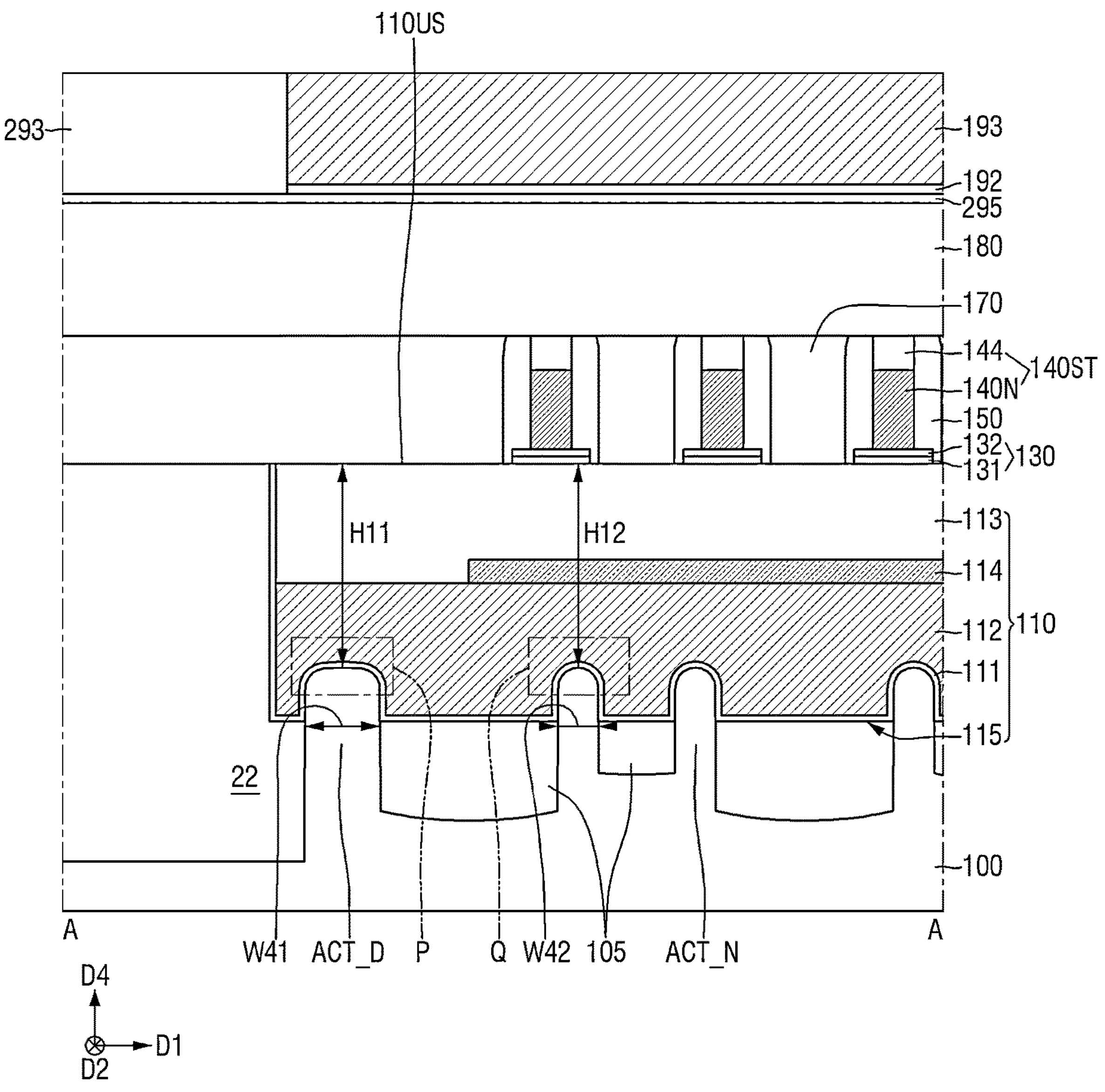
FIGS. 6 to 9 are cross-sectional views taken along lines A-A, B-B, C-C and D-D of FIG. 3.
Figure 7:
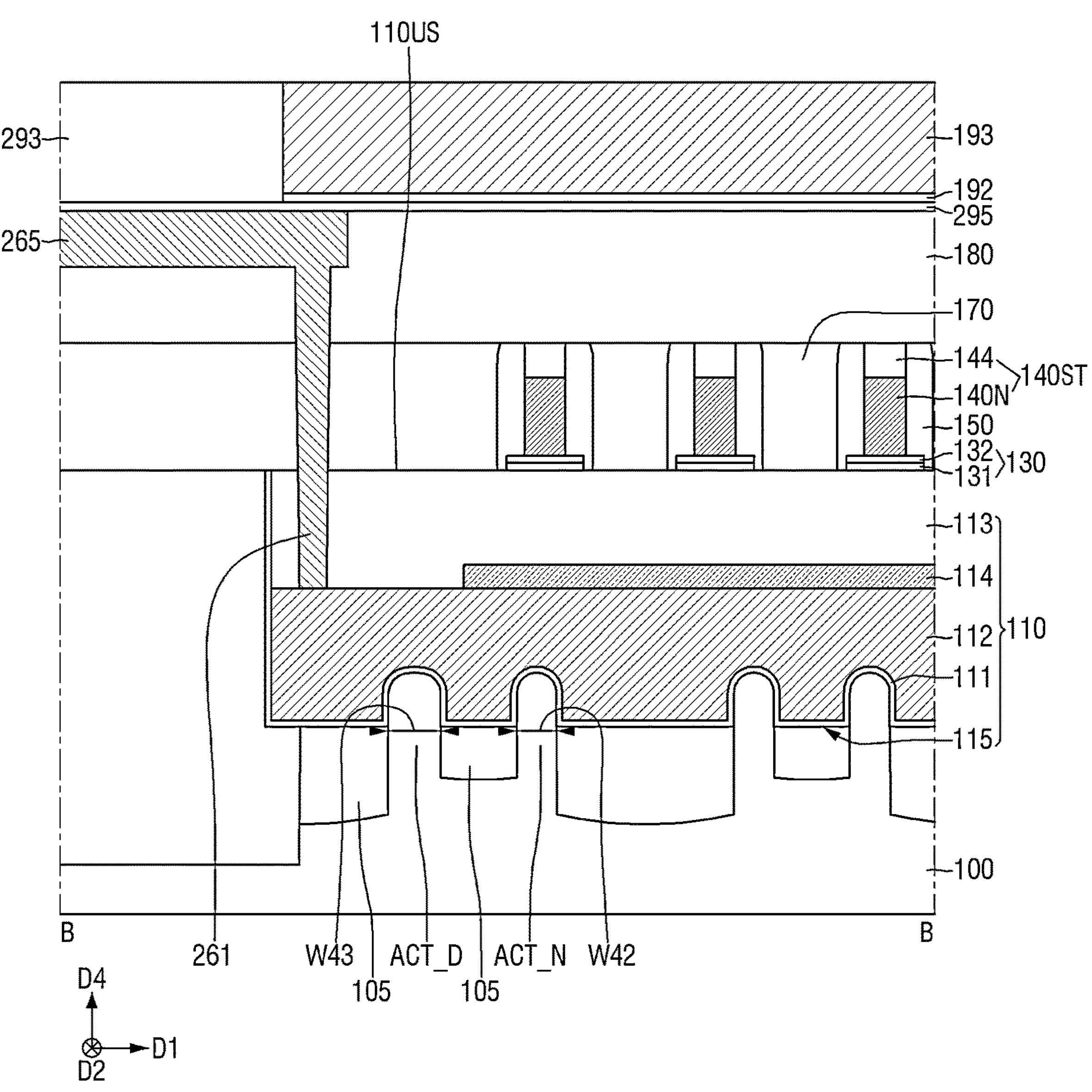

In FIG. 6, a width W41 of the dummy cell active area ACT_D at a portion where the dummy cell active area ACT_D intersects the cell gate electrode 112 is greater than a width W42 of the normal cell active area ACT_N at a portion where the normal cell active area ACT_N intersects the cell gate electrode 112. In FIG. 7, a width W43 of the dummy cell active area ACT_D at a portion where the dummy cell active area ACT_D intersects the cell gate electrode 112 may be greater than the width W42 of the normal cell active area ACT_N at a portion where the normal cell active area ACT_N intersects the cell gate electrode 112.

Since the width of the dummy cell active area ACT_D may vary depending on the position, the width W41 of the dummy cell active area ACT_D in FIG. 6 is greater than the width W43 of the dummy cell active area ACT_D in FIG. 7.

For example, a height H12 from the normal cell active area ACT_N to the upper surface 110US of the cell gate structure may be substantially the same as a height H11 from the dummy cell active area ACT_D to the upper surface 110US of the cell gate structure. In other words, in the cross-sectional views of FIGS. 6 and 7, with respect to the upper surface of the cell region isolation layer 22, the depth to the uppermost part of the dummy cell active area ACT_D may be substantially the same as the depth to the uppermost part of the normal cell active area ACT_N.

Figure 10:
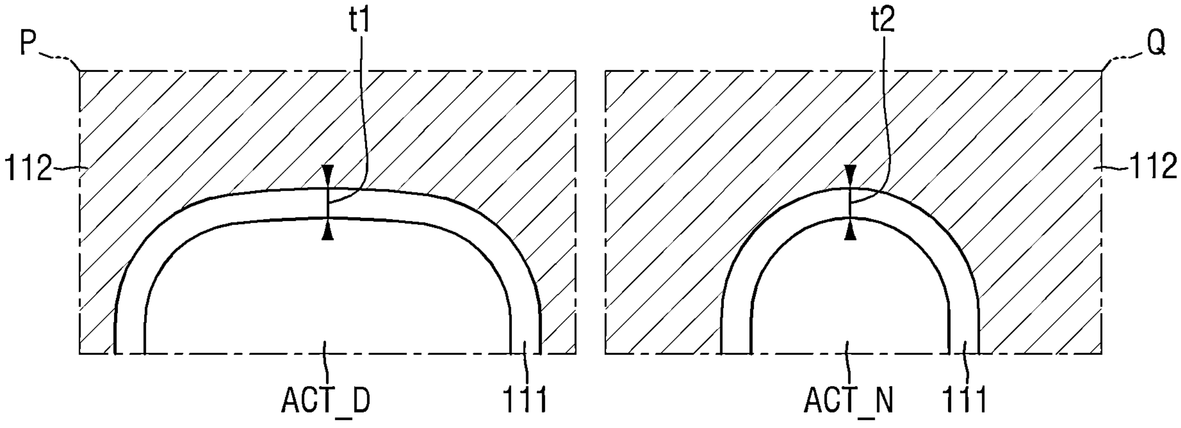
FIGS. 10 to 13 are enlarged views of regions P and Q of FIG. 6.
Figure 11:
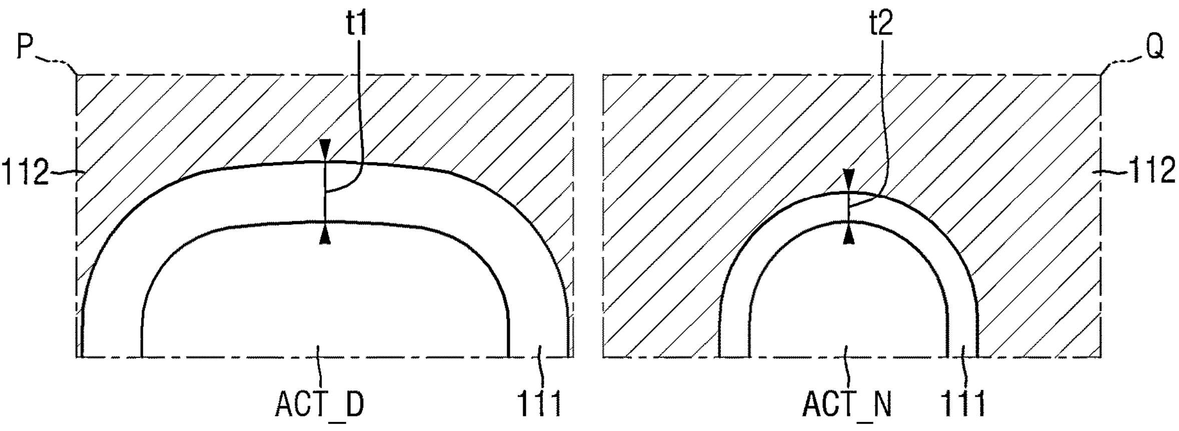

In FIGS. 10 and 11, the cell gate insulating layer 111 may be a single layer. The cell gate insulating layer 111 may include, for example, a silicon oxide layer.

In FIG. 10, a thickness t1 of the cell gate insulating layer 111 between the dummy cell active area ACT_D and the cell gate electrode 112 may be substantially the same as a thickness t2 of the cell gate insulating layer 111 between the normal cell active area ACT_N and the cell gate electrode 112. In FIG. 11, the thickness t1 of the cell gate insulating layer 111 between the dummy cell active area ACT_D and the cell gate electrode 112 may be greater than the thickness t2 of the cell gate insulating layer 111 between the normal cell active area ACT_N and the cell gate electrode 112.

Figure 12:
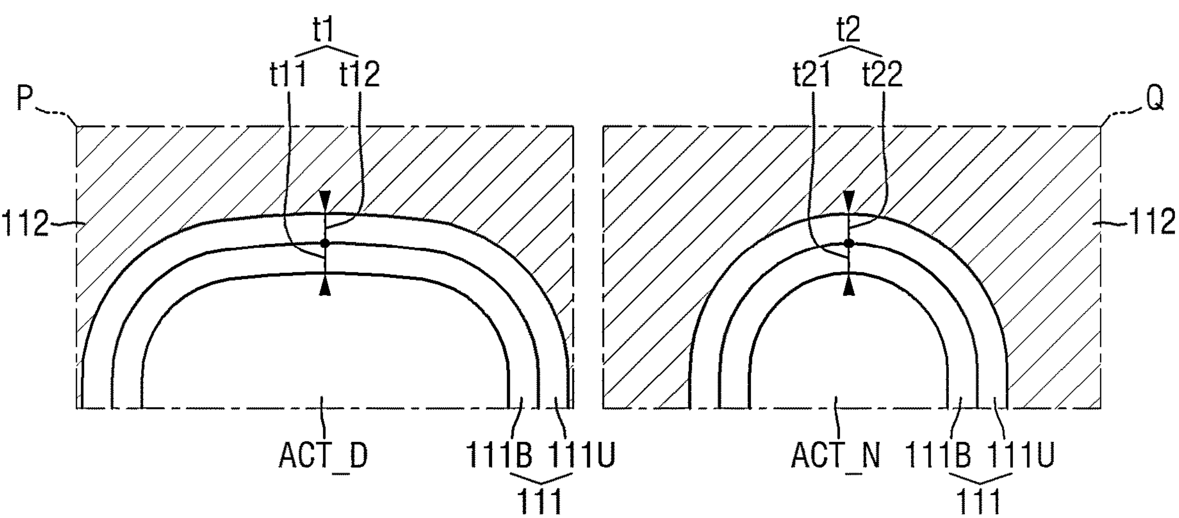
Figure 13:
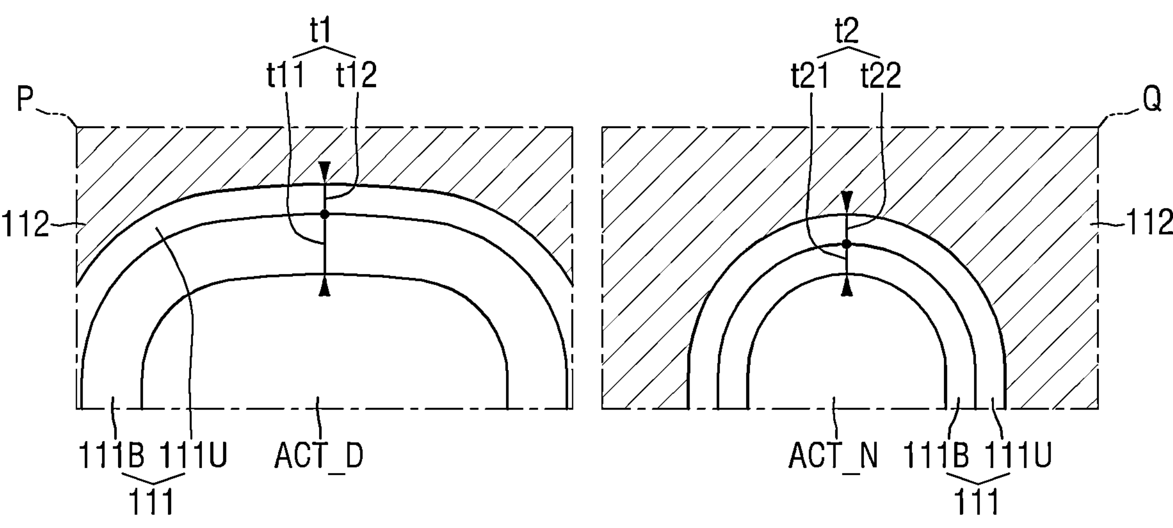

In FIGS. 12 and 13, the cell gate insulating layer 111 may be a multilayer. The cell gate insulating layer 111 may include a lower cell gate insulating layer 111B and an upper cell gate insulating layer 111U. The upper cell gate insulating layer 111U may be disposed between the lower cell gate insulating layer 111B and the cell gate electrode 112. The lower cell gate insulating layer 111B may include, for example, a silicon oxide layer. The upper cell gate insulating layer 111U may include, for example, a dielectric material having a dielectric constant higher than that of silicon oxide.

For example, a thickness t12 of the upper cell gate insulating layer 111U between the dummy cell active area ACT_D and the cell gate electrode 112 may be substantially the same as a thickness t22 of the upper cell gate insulating layer 111U between the normal cell active area ACT_N and the cell gate electrode 112.

In FIG. 12, a thickness t11 of the lower cell gate insulating layer 111B between the dummy cell active area ACT_D and the cell gate electrode 112 may be substantially the same as a thickness t21 of the lower cell gate insulating layer 111B between the normal cell active area ACT_N and the cell gate electrode 112. The thickness t1 of the cell gate insulating layer 111 between the dummy cell active area ACT_D and the cell gate electrode 112 may be substantially the same as the thickness t2 of the cell gate insulating layer 111 between the normal cell active area ACT_N and the cell gate electrode 112.

In FIG. 13, the thickness t11 of the lower cell gate insulating layer 111B between the dummy cell active area ACT_D and the cell gate electrode 112 may be greater than the thickness t21 of the lower cell gate insulating layer 111B between the normal cell active area ACT_N and the cell gate electrode 112. The thickness t1 of the cell gate insulating layer 111 between the dummy cell active area ACT_D and the cell gate electrode 112 may be greater than the thickness t2 of the cell gate insulating layer 111 between the normal cell active area ACT_N and the cell gate electrode 112.

The bit line structure 140ST of FIG. 7 may include the normal cell conductive line 140N and a cell line capping layer 144. The normal cell conductive line 140N may be disposed above the substrate 100 and the cell element isolation layer 105 on which the cell gate structure 110 is disposed.

The normal cell conductive line 140N may extend in the second direction D2. The normal cell conductive line 140N may intersect the cell element isolation layer 105 and the cell active area ACT defined by the cell element isolation layer 105. For example, the normal cell conductive line 140N may intersect the normal cell active area ACT_N. Here, the normal cell conductive line 140N may correspond to the bit line BL.

The normal cell conductive line 140N may include, for example, at least one of a semiconductor material doped with impurities, a conductive silicide compound, a conductive metal nitride, a two-dimensional (2D) material, a metal, or a metal alloy. In the semiconductor memory device according to some embodiments, the 2D material may be a metallic material and/or a semiconductor material. The 2D material may include a 2D allotrope or a 2D compound. For example, it may include at least one of graphene, molybdenum disulfide ($MoS_2$), molybdenum diselenide ($MoSe_2$), tungsten diselenide ($WSe_2$), or tungsten disulfide ($WS_2$), but is not limited thereto. That is, since the above-mentioned 2D materials are merely examples, the 2D materials that may be included in the semiconductor memory device of the present disclosure are not limited thereto.

Although the normal cell conductive line 140N is shown to be a single layer, it is only for simplicity of description, and the present disclosure is not limited thereto. That is, unlike the illustrated example, the normal cell conductive line 140N may include a plurality of conductive layers in which conductive materials are stacked.

The cell line capping layer 144 may be disposed on the normal cell conductive line 140N. The cell line capping layer 144 may extend in the second direction D2 along the upper surface of the normal cell conductive line 140N. The cell line capping layer 144 may include, for example, at least one of a silicon nitride layer, silicon oxynitride, silicon carbonitride, or silicon oxycarbonitride. In the semiconductor memory device according to some embodiments, the cell line capping layer 144 may include a silicon nitride layer. Although it is illustrated that the cell line capping layer 144 is a single layer, the present disclosure is not limited thereto.

A bit line contact 146 may be disposed between the normal cell conductive line 140N and the substrate 100. That is, the normal cell conductive line 140N may be disposed on the bit line contact 146. For example, the bit line contact 146 may be formed at a point where the normal cell conductive line 140N intersects the central portion of the normal cell active area ACT_N having a long island shape. The bit line contact 146 may be disposed between the first portion 103N_a of the normal cell active area and the normal cell conductive line 140N.

The bit line contact 146 may electrically connect the normal cell conductive line 140N to the substrate 100. Here, the bit line contact 146 may correspond to the direct contact (DC). The bit line contact 146 may include, for example, at least one of a semiconductor material doped with impurities, a conductive silicide compound, conductive metal nitride, or metal.

In FIG. 8, the thickness of the normal cell conductive line 140N in a region overlapping an upper surface 146US of the bit line contact may be different from the thickness of the normal cell conductive line 140N in a region not overlapping the upper surface 146US of the bit line contact.

A cell insulating layer 130 may be formed on the substrate 100 and the cell element isolation layer 105. More specifically, the cell insulating layer 130 may be disposed on the cell element isolation layer 105 and the substrate 100 on which the bit line contact 146 is not formed. The cell insulating layer 130 may be disposed between the substrate 100 and the normal cell conductive line 140N, and between the cell element isolation layer 105 and the normal cell conductive line 140N. In the semiconductor memory device according to some embodiments, with respect to the upper surface of the substrate 100, the upper surface 146US of the bit line contact may be higher than an upper surface 130US of the cell insulating layer.

The cell insulating layer 130 may be a single layer, but as shown, the cell insulating layer 130 may be a multilayer including a first cell insulating layer 131 and a second cell insulating layer 132. For example, the first cell insulating layer 131 may include a silicon oxide layer, and the second cell insulating layer 132 may include a silicon nitride layer, but they are not limited thereto. Unlike the illustrated example, the cell insulating layer 130 may include three or more insulating layers. When the cell insulating layer 130 includes a third cell insulating layer, the third cell insulating layer may be a silicon oxide layer.

A cell line spacer 150 may be disposed on the sidewall of the normal cell conductive line 140N and the sidewall of the cell line capping layer 144. In a portion of the normal cell conductive line 140N on which the bit line contact 146 is formed, the cell line spacer 150 may be formed on the substrate 100 and the cell element isolation layer 105. The cell line spacer 150 may be disposed on the sidewall of the normal cell conductive line 140N, the sidewall of the cell line capping layer 144, and the sidewall of the bit line contact 146.

The cell line spacer 150 may be disposed on the cell insulating layer 130 in the remaining portion of the normal cell conductive line 140N on which the bit line contact 146 is not formed. The cell line spacer 150 may be disposed on the sidewall of the normal cell conductive line 140N and the sidewall of the cell line capping layer 144.

Although the cell line spacer 150 is illustrated as being a single layer, this is merely for simplicity of description and the present disclosure is not limited thereto. That is, unlike the illustrated example, the cell line spacer 150 may have a multilayer structure. The cell line spacer 150 may include, for example, one of a silicon oxide layer, a silicon nitride layer, a silicon oxynitride layer (SiON), a silicon oxycarbonitride layer (SiOCN), air, and/or a combination thereof, but is not limited thereto. For example, the cell line spacer 150 may be formed of a double layer of a silicon oxide layer and a silicon nitride layer.

In FIG. 9, a fence pattern 170 may be disposed on the substrate 100 and the cell element isolation layer 105. The fence pattern 170 may be disposed to overlap the cell gate structure 110 formed in the substrate 100 and the cell element isolation layer 105. The fence pattern 170 may be disposed on the cell gate capping pattern 113.

The fence pattern 170 may be disposed between the bit line structures 140ST extending in the second direction D2. The fence pattern 170 may include, for example, at least one of silicon oxide, silicon nitride, silicon oxynitride, or a combination thereof. For example, the height of the fence pattern 170 may be substantially the same as that of the cell line capping layer 144.

A plurality of storage contacts 120 may be disposed between the normal cell conductive lines 140N adjacent in the first direction D1. The storage contact 120 may be disposed between the fence patterns 170 adjacent in the second direction D2. The storage contact 120 may overlap, in the fourth direction D4, the substrate 100 and the cell element isolation layer 105 between the adjacent normal cell conductive lines 140N. The storage contact 120 may be connected to the second upper portion 103N_bU of the normal cell active area and the second lower portion 103N_bL of the normal cell active area. Here, the storage contact 120 may correspond to the buried contact BC.

The storage contact 120 may include, for example, at least one of a semiconductor material doped with impurities, a conductive silicide compound, conductive metal nitride, or metal.

The storage pad 160 may be disposed on each storage contact 120. The storage pad 160 may be electrically connected to the storage contact 120. The storage pad 160 may be connected to the second upper portion 103N_bU of the normal cell active area and the second lower portion 103N_bL of the normal cell active area. Here, the storage pad 160 may correspond to the landing pad LP.

The storage pad 160 may overlap a part of the upper surface of the normal cell conductive line 140N. The storage pad 160 may include, for example, at least one of a semiconductor material doped with impurities, a conductive silicide compound, a conductive metal nitride, a conductive metal carbide, a metal, and/or a metal alloy.

A pad separation insulating layer 180 may be disposed on the storage pad 160 and the normal cell conductive line 140N. For example, the pad separation insulating layer 180 may be disposed on the cell line capping layer 144. The pad separation insulating layer 180 may define the storage pads 160 forming a plurality of isolation regions. The pad separation insulating layer 180 may not cover or overlap the upper surface of the storage pad 160 in a direction perpendicular to the substrate. The pad separation insulating layer 180 may fill or at least partially fill a pad separation recess. The pad separation recess may separate adjacent storage pads 160 from each other.

The pad separation insulating layer 180 may include an insulating material to electrically separate the plurality of storage pads 160 from each other. For example, the pad separation insulating layer 180 may include, for example, at least one of a silicon oxide layer, a silicon nitride layer, a silicon oxynitride layer, a silicon oxycarbonitride layer, or a silicon carbonitride layer, but is not limited thereto.

A cell upper etch stop layer 295 may be disposed on the upper surface of the storage pad 160 and the upper surface of the pad separation insulating layer 180. The cell upper etch stop layer 295 may include, for example, at least one of silicon nitride (SiN), silicon carbonitride (SiCN), silicon oxycarbonitride (SiOCN), silicon oxycarbide (SiOC), or silicon boron nitride (SiBN).

The data storage patterns DSP may be disposed on the storage pad 160. The data storage patterns DSP is connected to the storage pad 160. A part of the data storage patterns DSP may be disposed in the cell upper etch stop layer 295.

For example, the data storage patterns DSP may be a capacitor. The data storage patterns DSP includes the lower electrode 191, a capacitor dielectric layer 192, and an upper electrode 193. For example, the upper electrode 193 may be a plate upper electrode having a plate shape.

The lower electrode 191 may be disposed on the storage pad 160. The lower electrode 191 may have, for example, a pillar shape. The capacitor dielectric layer 192 is disposed on the lower electrode 191. The capacitor dielectric layer 192 may be formed along the profile of the lower electrode 191. The upper electrode 193 is disposed on the capacitor dielectric layer 192. The upper electrode 193 may surround, overlap, or be on the outer wall of the lower electrode 191. Although the upper electrode 193 is illustrated as being a single layer, this is only for simplicity of description, and the present disclosure is not limited thereto. Unlike the illustrated example, the lower electrode 191 may have a cylindrical shape with one side open.

Each of the lower electrode 191 and the upper electrode 193 may include, for example, a doped semiconductor material, conductive metal nitride (e.g., titanium nitride, tantalum nitride, niobium nitride, tungsten nitride, or the like), metal (e.g., ruthenium, iridium, titanium, tantalum, or the like), conductive metal oxide (e.g., iridium oxide, niobium oxide, or the like), or the like, but the present disclosure is not limited thereto.

The capacitor dielectric layer 192 may include, for example, one of silicon oxide, silicon nitride, silicon oxynitride, a high-k material, and/or a combination thereof, but is not limited thereto. In the semiconductor memory device according to some embodiments, the capacitor dielectric layer 192 may have a stacked structure including a ferroelectric material layer and a paraelectric material layer.

On the other hand, the data storage patterns DSP may be variable resistance patterns that can be switched into two resistance states by an electrical pulse applied to a memory element. For example, the data storage patterns DSP may include a phase-change material whose crystalline state changes depending on the amount of current, perovskite compounds, transition metal oxide, magnetic materials, ferromagnetic materials, or antiferromagnetic materials.

A peri-capping insulating layer 293 may be disposed on the cell upper etch stop layer 295. The peri-capping insulating layer 293 may cover, overlap, or be on the sidewall of the upper electrode 193. The peri-capping insulating layer 293 may include, for example, at least one of a silicon oxide layer, a silicon nitride layer, a silicon oxynitride layer, a silicon oxycarbonitride layer, or a silicon carbonitride layer, but is not limited thereto.

A peri-connection line 265 may be disposed on the cell region isolation layer 22. The peri-connection line 265 may extend to the peripheral region 24. For example, the peri-connection line 265 may connect the cell gate electrode 112 to the peri-gate structure PG_GE.

A cell gate plug 261 may be disposed on the cell gate electrode 112. The cell gate plug 261 is connected to the cell gate electrode 112. The cell gate plug 261 may be connected to the cell gate electrode 112, for example, in the head regions 110HR1 and 110HR2 of the cell gate structure.

The cell gate plug 261 is disposed between the cell gate electrode 112 and the peri-connection line 265. The cell gate plug 261 connects the cell gate electrode 112 to the peri-connection line 265.

For example, the entire bottom surface of the cell gate plug 261 may be in contact with the cell gate electrode 112. The entire bottom surface of the cell gate plug 261 may overlap the upper surface of the cell gate electrode 112 in the fourth direction D4. In other words, the cell gate plug 261 may not be in contact with the sidewall of the cell gate electrode 112. The cell gate plug 261 may not be in contact with the cell gate capping conductive layer 114. The sidewall of the cell gate electrode 112 may face the cell region isolation layer 22.

In FIGS. 3 and 5 to 7, the plurality of cell gate structures 110 may include a first cell gate structure and a second cell gate structure that are closest in the second direction D2. The first head region of the first cell gate structure and the first head region of the second cell gate structure may be arranged in the second direction D2. The second head region of the first cell gate structure and the second head region of the second cell gate structure may be arranged in the second direction D2. For example, the cell gate plug 261 may be connected to the cell gate electrode 112 in the first head region of the first cell gate structure. However, the cell gate plug 261 is not connected to the cell gate electrode 112 in the first head region of the second cell gate structure. The cell gate plug 261 may be connected to the cell gate electrode 112 in the second head region of the second cell gate structure.

Each of the peri-connection line 265 and the cell gate plug 261 may include at least one of a semiconductor material doped with impurities, a conductive silicide compound, a conductive metal nitride, a conductive metal carbide, a metal, or a metal alloy.

Figure 15:
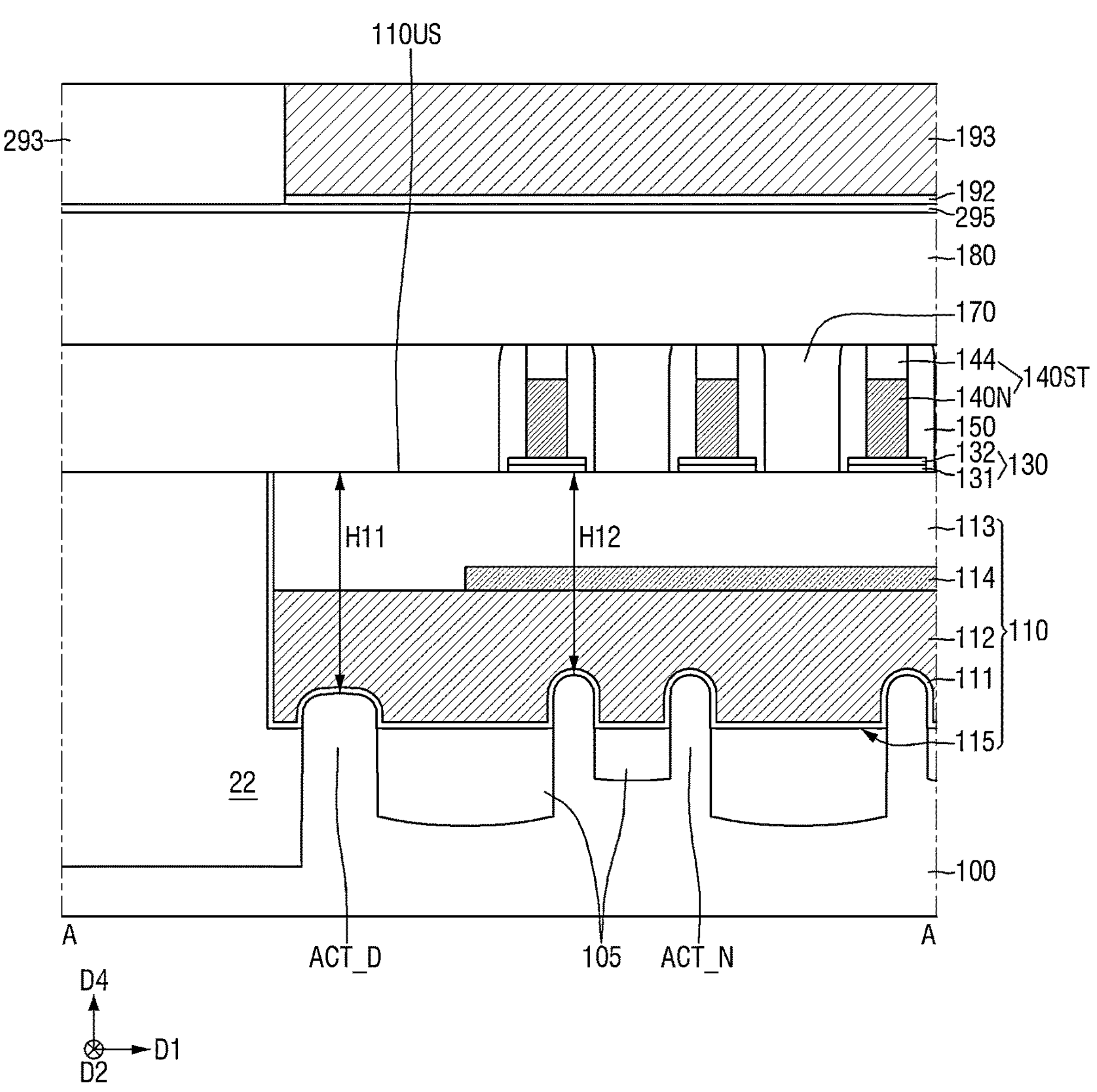
Figure 16:
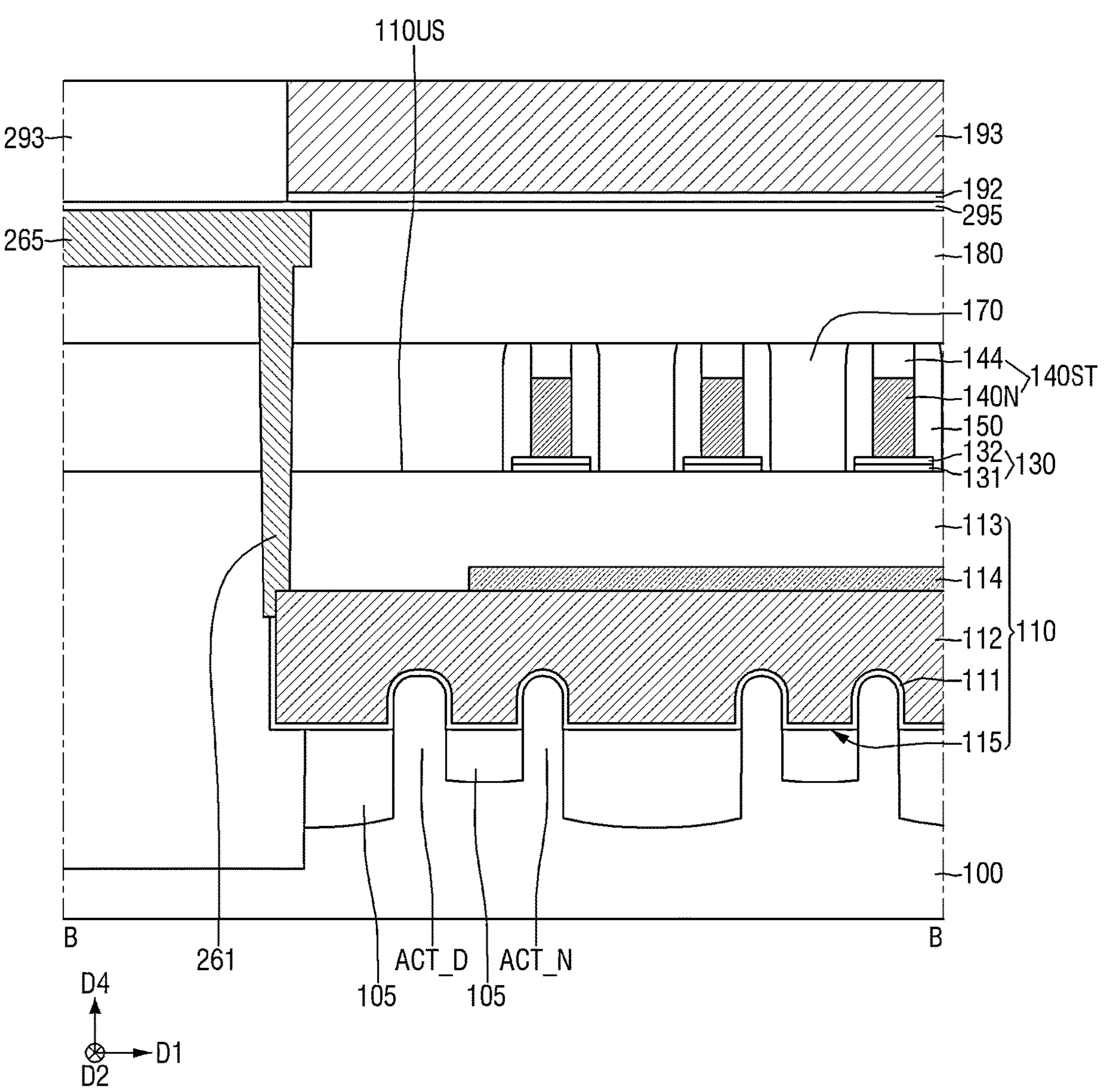

FIGS. 14 to 16 are diagrams each illustrating a semiconductor memory device according to some embodiments. For simplicity of description, the following description will focus on differences from the description with reference to FIGS. 1 to 13.

Referring to FIGS. 14 and 15, in the semiconductor memory device according to some embodiments, the height H12 from the normal cell active area ACT_N to the upper surface 110US of the cell gate structure may be different from the height H11 from the dummy cell active area ACT_D to the upper surface 110US of the cell gate structure.

With respect to the upper surface of the cell region isolation layer 22, the depth to the uppermost part of the dummy cell active area ACT_D may be different from the depth to the uppermost part of the normal cell active area ACT_N.

In FIG. 14, the height H12 from the normal cell active area ACT_N to the upper surface 110US of the cell gate structure may be greater than the height H11 from the dummy cell active area ACT_D to the upper surface 110US of the cell gate structure.

In FIG. 15, the height H12 from the normal cell active area ACT_N to the upper surface 110US of the cell gate structure may be smaller than the height H11 from the dummy cell active area ACT_D to the upper surface 110US of the cell gate structure. The height of the dummy cell active area ACT_D in the fourth direction D4 may be smaller than the height of the normal cell active area ACT_N in the fourth direction D4.

Referring to FIG. 16, in the semiconductor memory device according to some embodiments, the cell gate plug 261 may be in contact with the sidewall of the cell gate electrode 112 and the upper surface of the cell gate electrode 112.

A part of the bottom surface of the cell gate plug 261 may overlap the upper surface of the cell gate electrode 112 in the fourth direction D4. The rest of the bottom surface of the cell gate plug 261 does not overlap the upper surface of the cell gate electrode 112 in the fourth direction D4. The bottom surface of the cell gate plug 261 may be in contact with the cell gate insulating layer 111.

Figure 17:
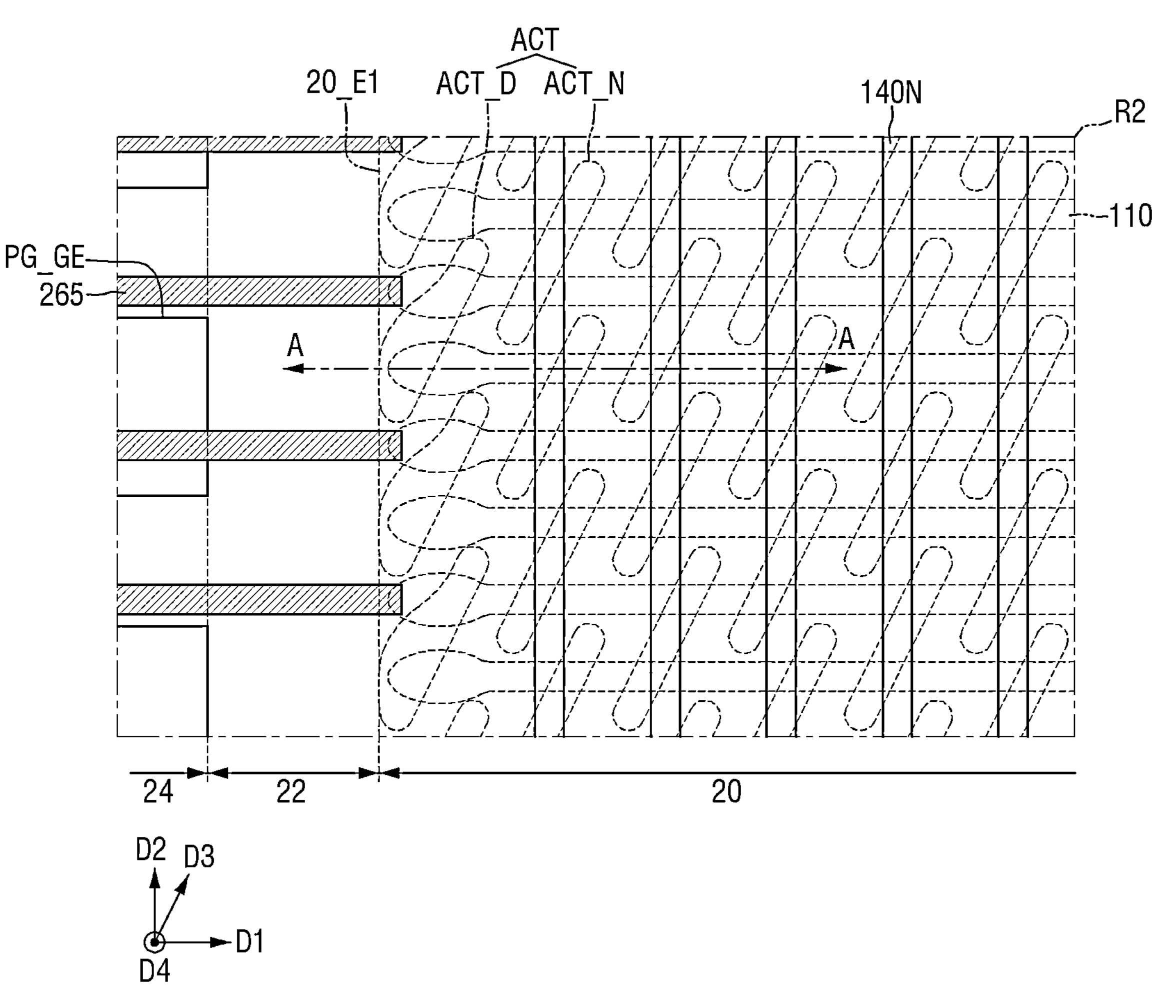
FIGS. 17 to 19 are diagrams illustrating a semiconductor memory device according to some embodiments.
Figure 18:
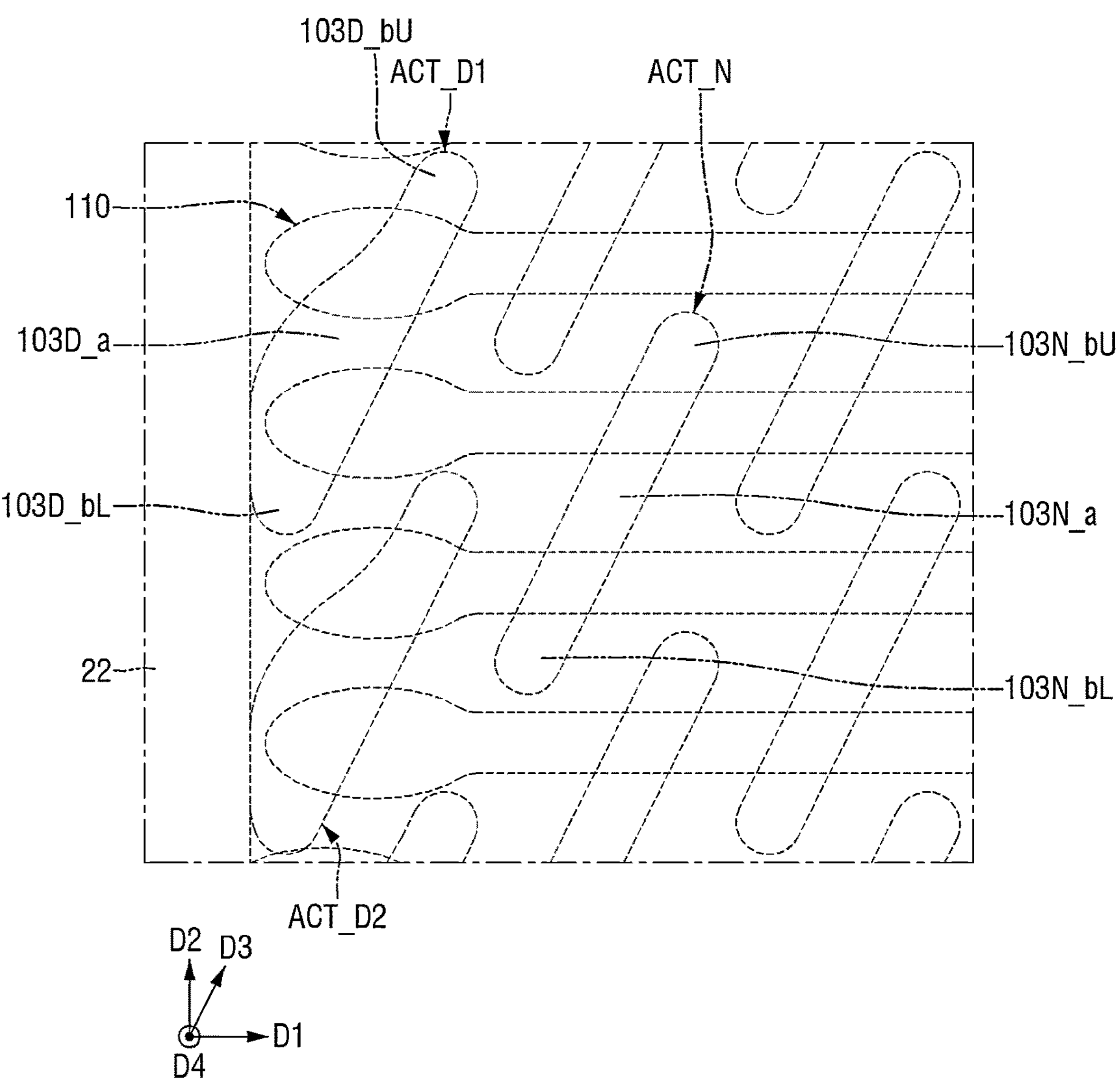
Figure 19:
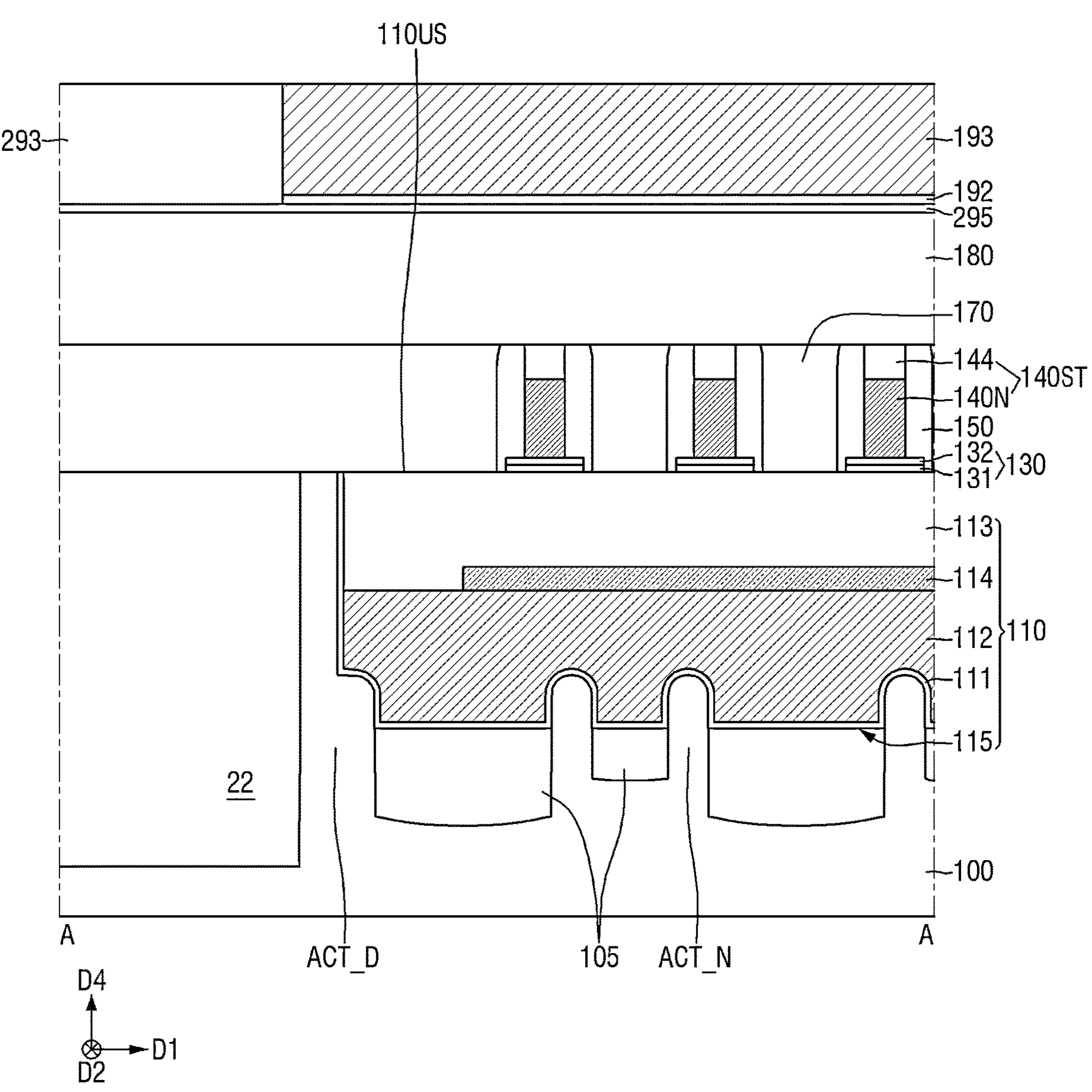

FIGS. 17 to 19 are diagrams illustrating a semiconductor memory device according to some embodiments. For simplicity of description, the following description will focus on differences from the description with reference to FIGS. 1 to 13.

For reference, FIG. 17 is a plan view of region R2 of FIG. 1. FIG. 18 is a plan view illustrating only a cell gate structure and an active area in a partial region of FIG. 17. FIG. 19 is a cross-sectional view taken along line A-A of FIG. 17.

Referring to FIGS. 5 and 17 to 19, in the semiconductor memory device according to some embodiments, the entire head regions 110HR1 and 110HR2 of the cell gate structure may be disposed in the cell region 20.

The entire first head region 110HR1 of the cell gate structure may overlap the cell element isolation layer 105 and the cell active area ACT in the fourth direction D4. The entire second head region 110HR2 of the cell gate structure may overlap the cell element isolation layer 105 and the cell active area ACT in the fourth direction D4.

In FIG. 17, a part of the dummy cell active area ACT_D may be interposed between the cell region isolation layer 22 and the cell gate structure 110. Unlike the illustrated example, the dummy cell active area ACT_D may not be interposed between the cell region isolation layer 22 and the cell gate structure 110.

Figure 20:
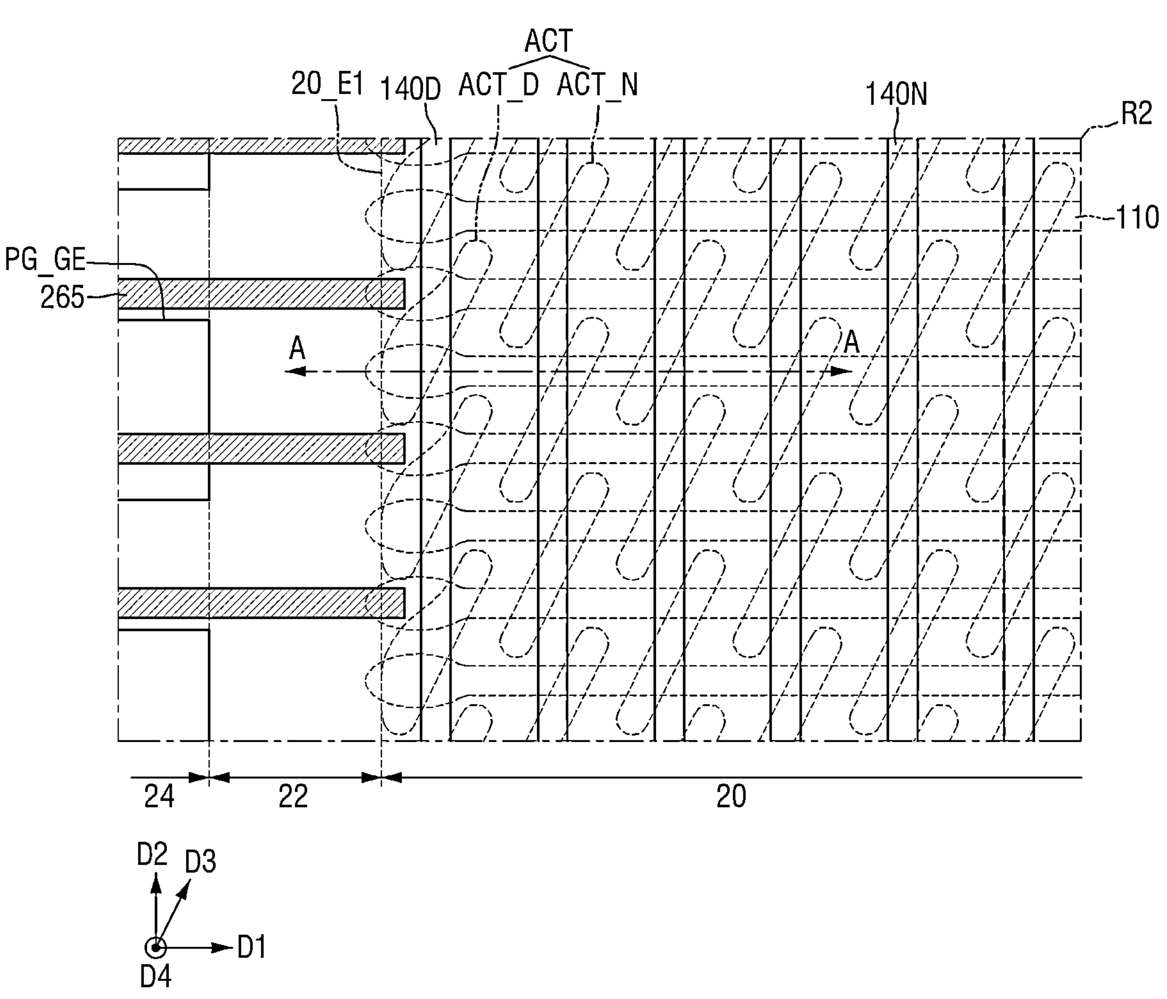
FIGS. 20 and 21 are diagrams illustrating a semiconductor memory device according to some embodiments.
Figure 21:
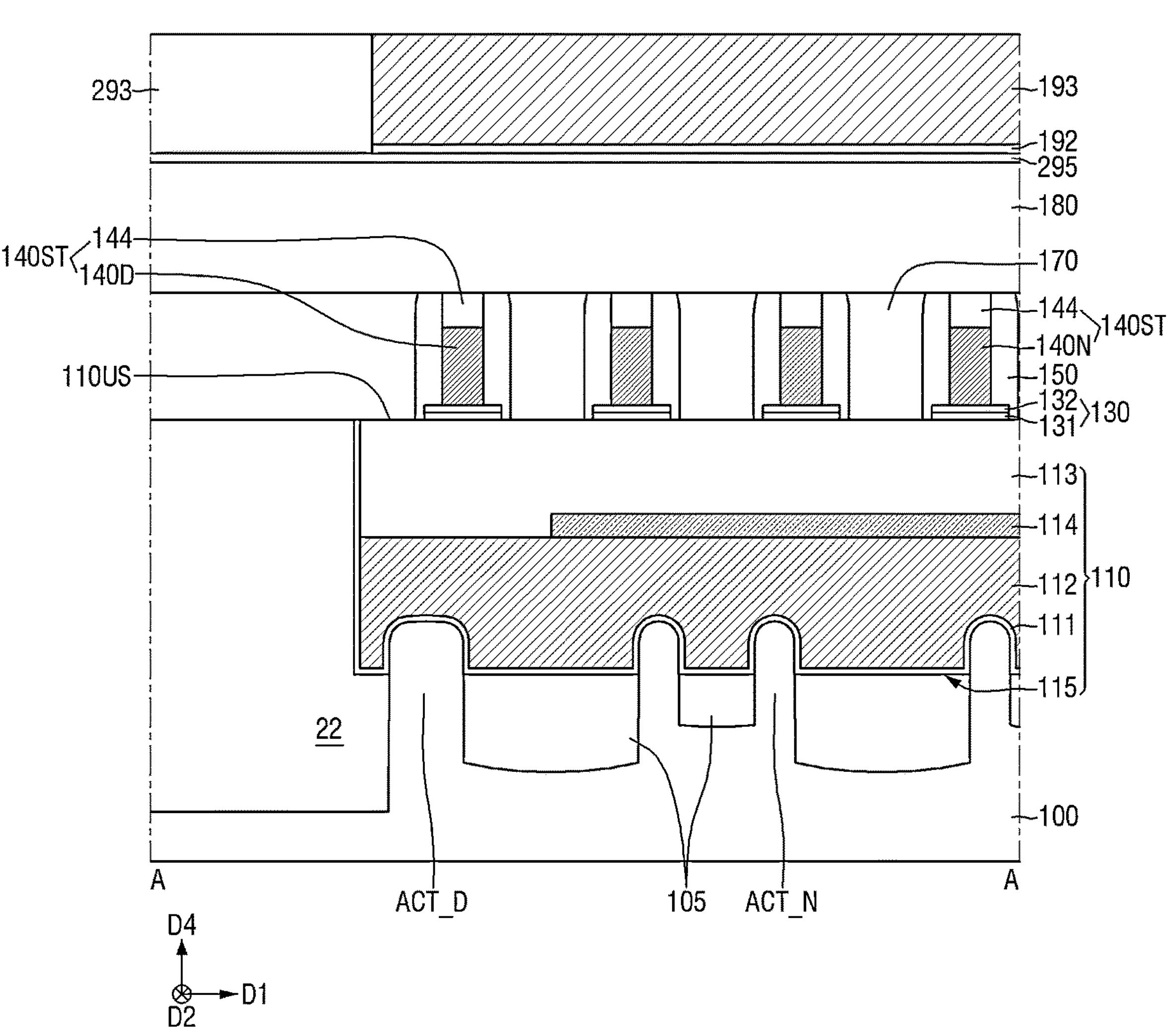

FIGS. 20 and 21 are diagrams illustrating a semiconductor memory device according to some embodiments. For simplicity of description, the following description will focus on differences from the description with reference to FIGS. 1 to 13.

For reference, FIG. 20 is a plan view of region R2 of FIG. 1. FIG. 21 is a cross-sectional view taken along line A-A of FIG. 20.

Referring to FIGS. 20 and 21, the semiconductor memory device according to some embodiments may further include the dummy cell conductive line 140D intersecting the dummy cell active area ACT_D.

The dummy cell conductive line 140D may be disposed above the substrate 100 and the cell element isolation layer 105 on which the cell gate structure 110 is disposed. The dummy cell conductive line 140D may extend in the second direction D2.

The dummy cell conductive line 140D may intersect the cell element isolation layer 105 and the cell active area ACT defined by the cell element isolation layer 105. For example, the dummy cell conductive line 140D may intersect the dummy cell active area ACT_D.

A part of the bit line structure 140ST may include the dummy cell conductive line 140D and the cell line capping layer 144. The rest of the bit line structure 140ST may include the normal cell conductive line 140N and the cell line capping layer 144.

The dummy cell conductive line 140D includes the same material as the normal cell conductive line 140N.

Figure 22:
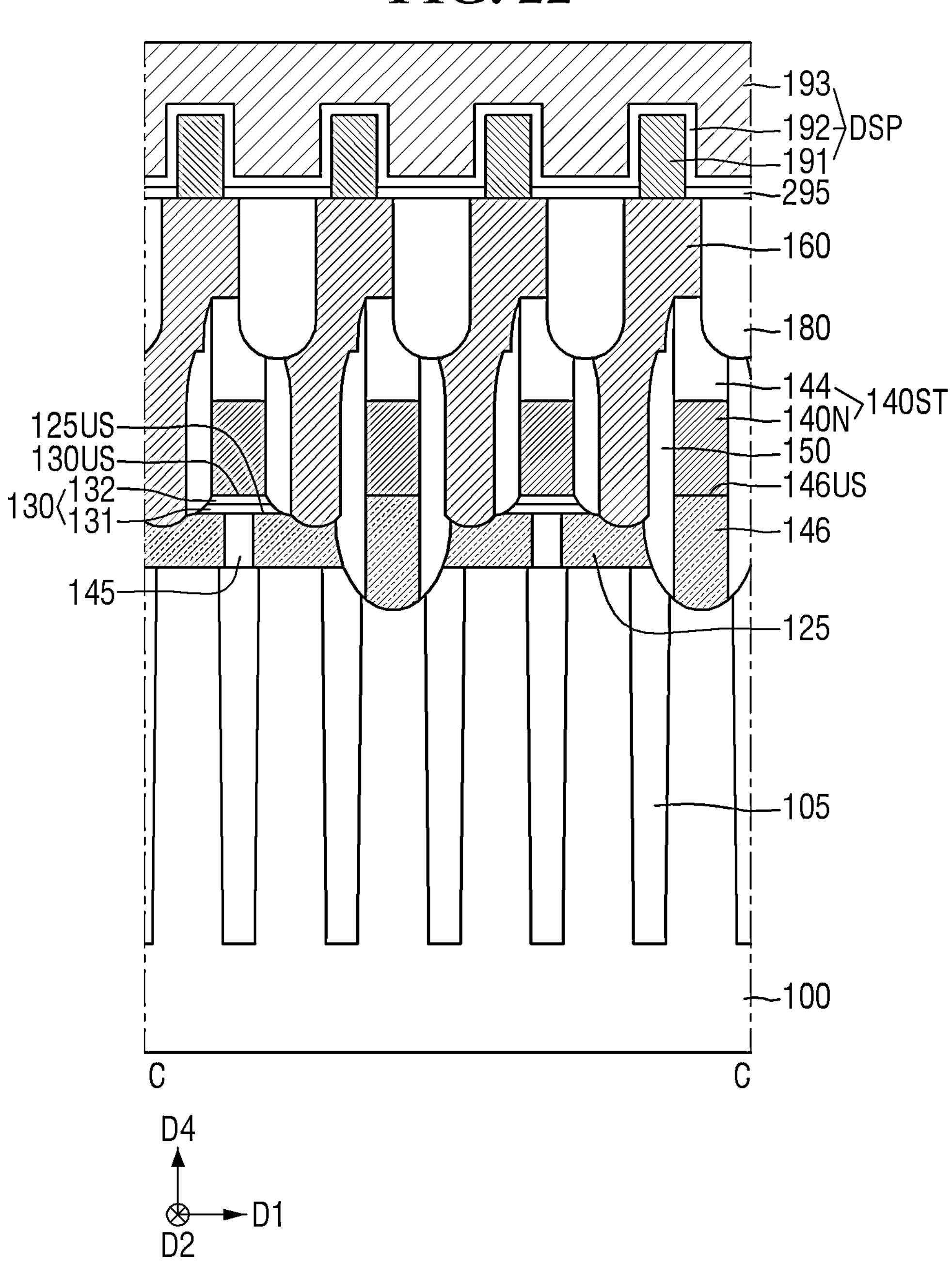
FIG. 22 is a diagram illustrating a semiconductor device according to some embodiments.

FIG. 22 is a diagram illustrating a semiconductor device according to some embodiments. For simplicity of description, the following description will focus on differences from the description with reference to FIGS. 1 to 13.

For reference, FIG. 22 may be a cross-sectional view taken along line C-C of FIG. 3.

Referring to FIG. 22, in the semiconductor memory device according to some embodiments, a storage contact 125 may be disposed on the substrate 100 and the cell element isolation layer 105.

The storage contact 125 may be disposed on the upper surface of the cell element isolation layer 105. The bottom surface of the storage contact 125 may be disposed on the upper surface of the cell element isolation layer 105. The storage contact 125 may be in contact with the upper surface of the cell element isolation layer 105.

With respect to the upper surface of the cell element isolation layer 105, an upper surface 125US of the storage contact may be lower than the upper surface 146US of the bit line contact. With respect to the upper surface of the cell element isolation layer 105, the upper surface 125US of the storage contact may be lower than the bottom surface of the normal cell conductive line 140N.

A contact separation pattern 145 may separate storage contact 125 adjacent in the first direction DR from each other. When the storage contact 125 includes a first storage contact and a second storage contact that are spaced apart in the first direction D1, the contact separation pattern 145 may separate the first storage contact from the second storage contact in the first direction D1. Although not shown, the contact separation pattern 145 may also separate the storage contact 125 adjacent in the second direction D2 from each other.

The cell line spacer 150 may be disposed on the upper surface 125US of the storage contact. The cell insulating layer 130 may cover the upper surface 125US of the storage contact. When the storage contact 125 includes a first storage contact and a second storage contact that are spaced apart in the first direction D1, the cell insulating layer 130 may cover or overlap the upper surface of the first storage contact and the upper surface of the second storage contact.

The upper surface 130US of the cell insulating layer may be on the same plane as the upper surface 146US of the bit line contact. That is, with respect to the upper surface of the cell element isolation layer 105, the height of the upper surface 130US of the cell insulating layer may be the same as the height of the upper surface 146US of the bit line contact. The normal cell conductive line 140N may be disposed on the upper surface 130US of the cell insulating layer.

The contact separation pattern 145 may include, for example, at least one of silicon nitride (SiN), silicon oxynitride (SiON), silicon oxide ($SiO_2$), silicon carbonitride (SiCN), silicon oxycarbonitride (SiOCN), or a combination thereof. It is illustrated that the width of the cell insulating layer 130 in the first direction D1 decreases as the distance from the substrate 100 increases, but the present disclosure is not limited thereto.

Figure 23:
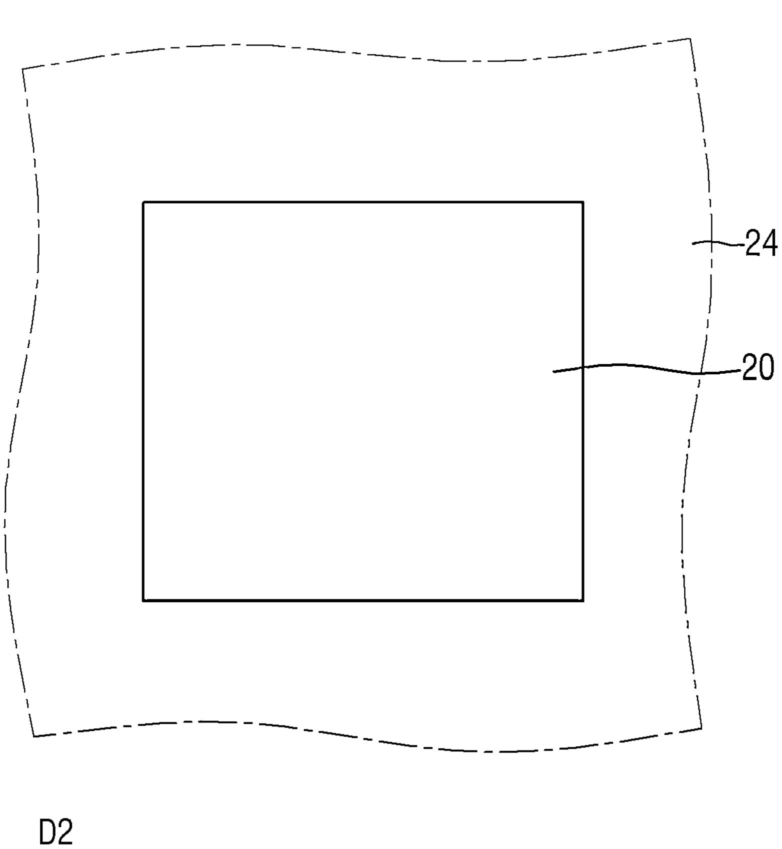
FIGS. 23 and 28 are diagrams illustrating a semiconductor memory device according to some embodiments.
Figure 28:
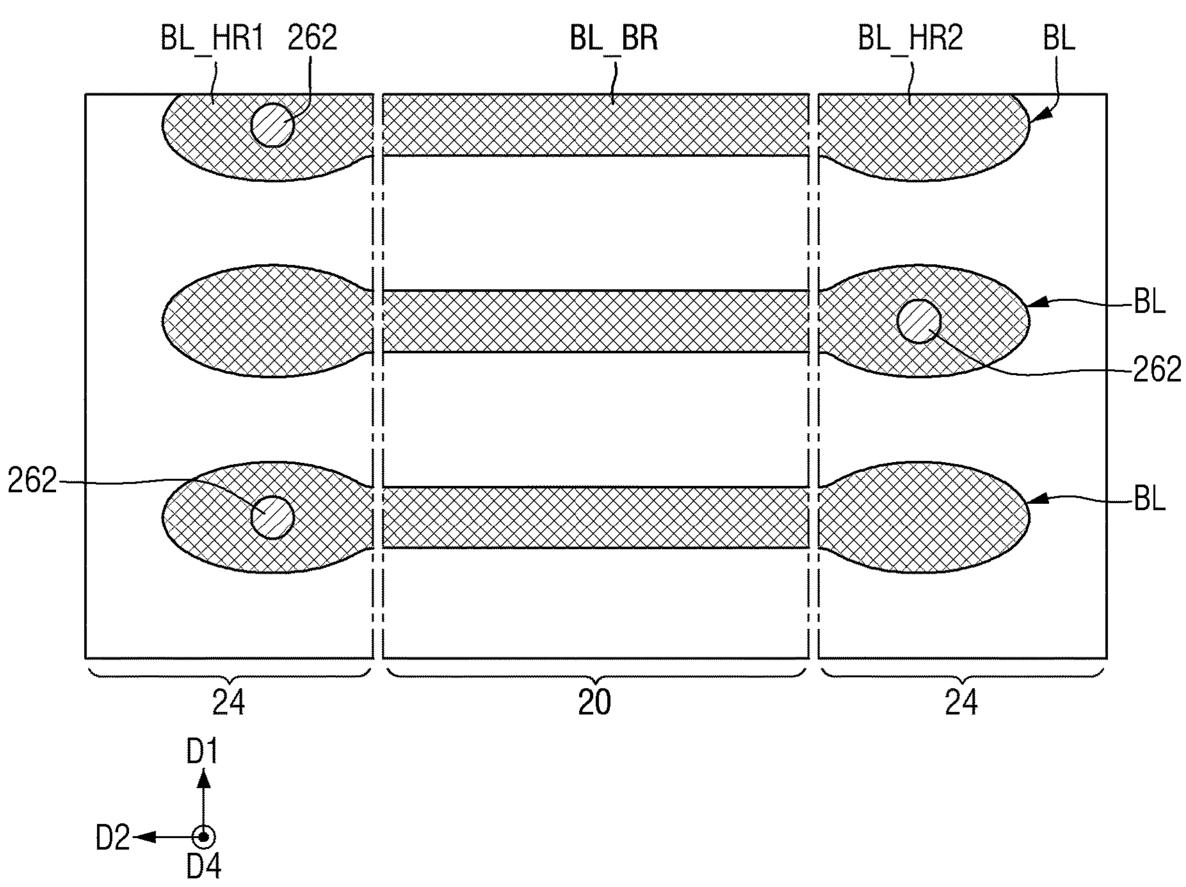

FIGS. 23 and 28 are diagrams illustrating a semiconductor memory device according to some embodiments.

Figure 24:
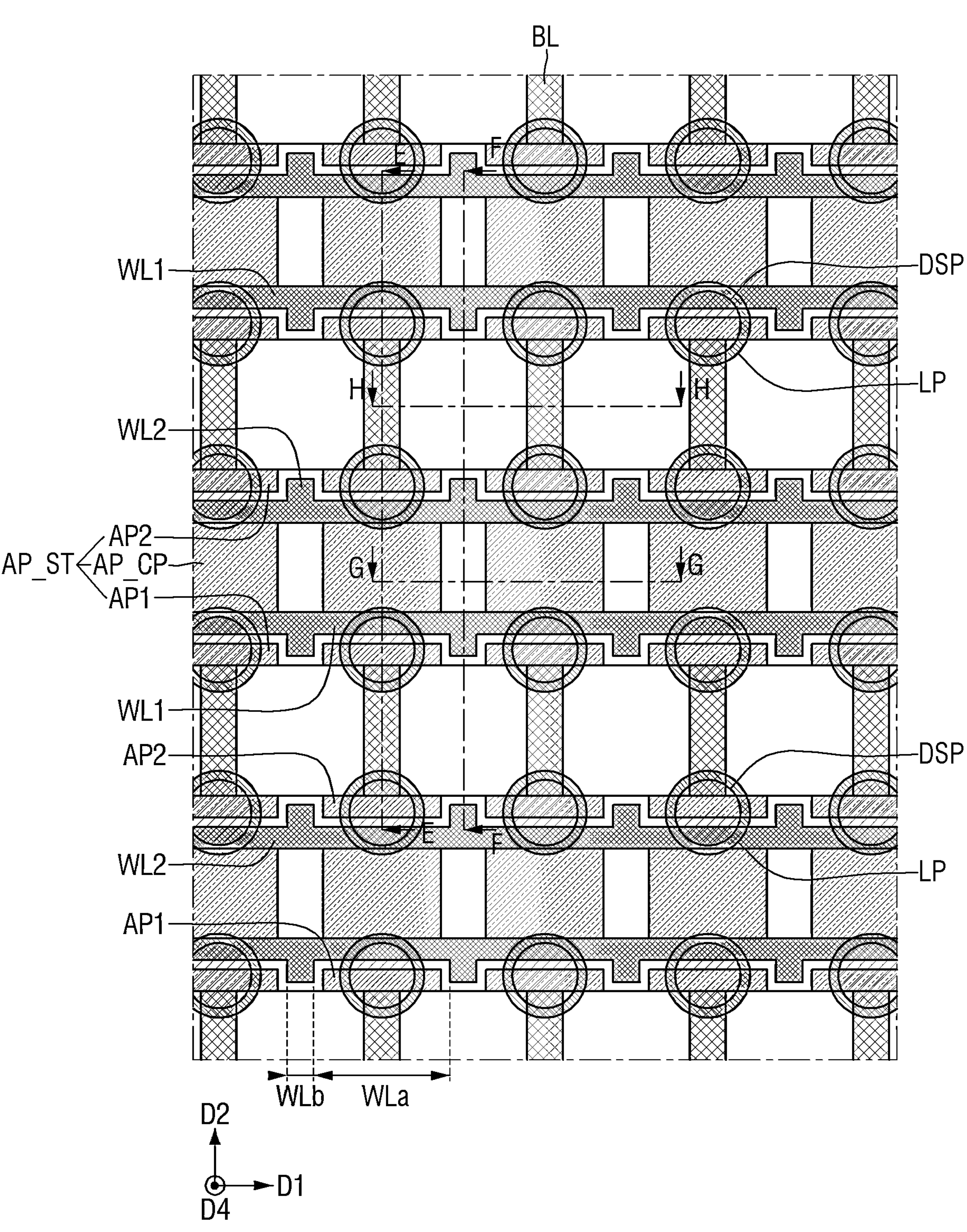
Figure 25:
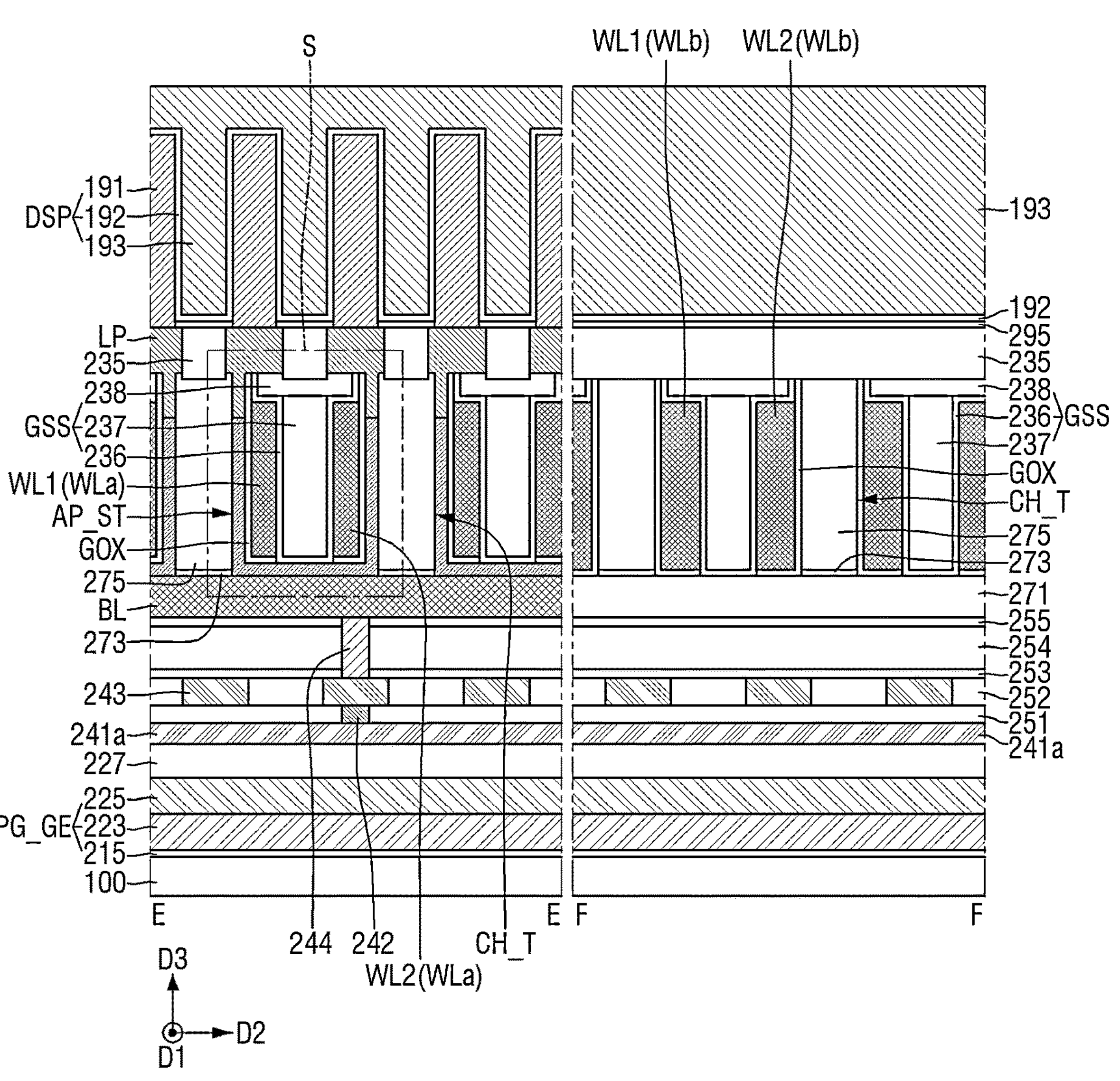
Figure 26:
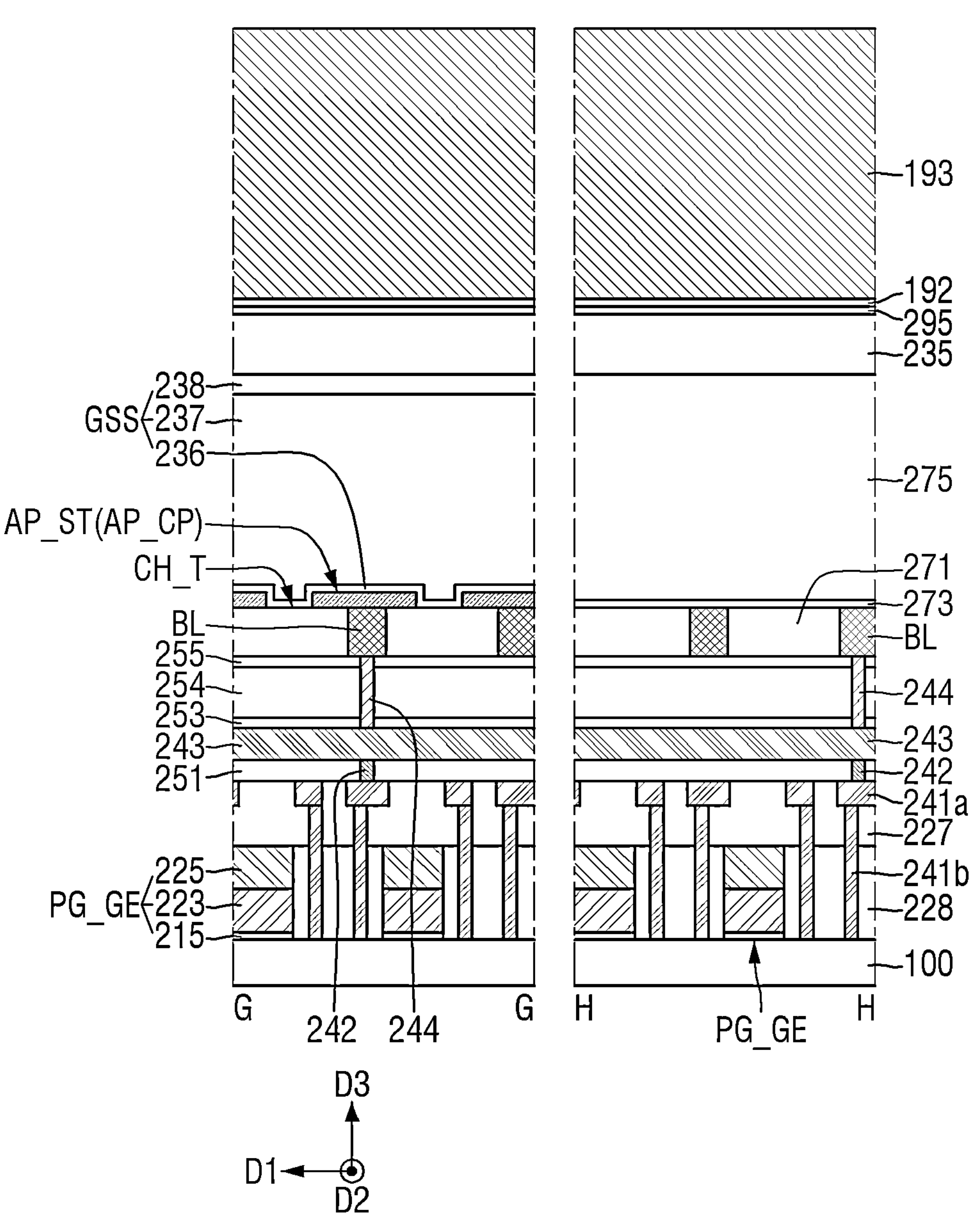
Figure 27:
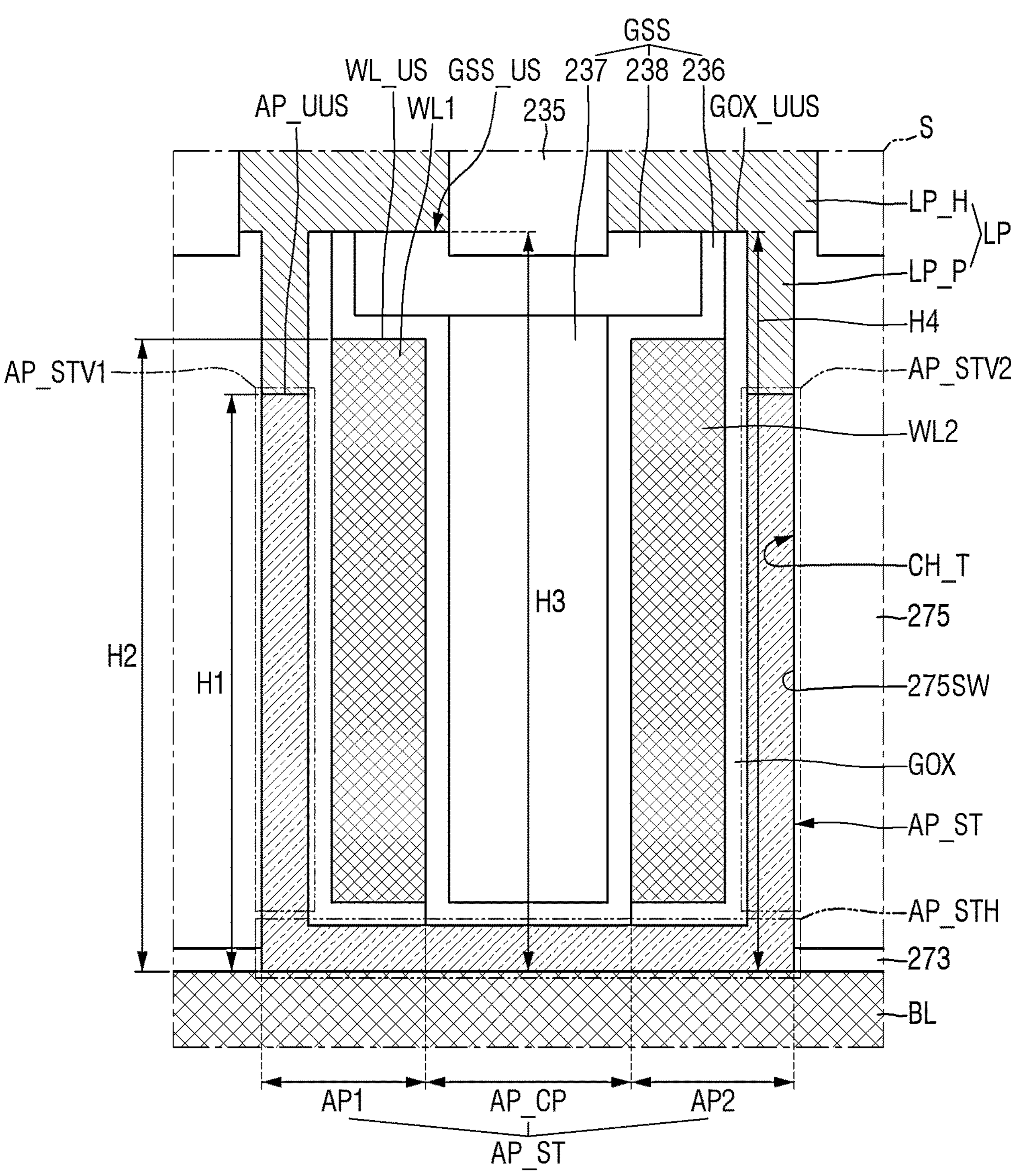

For reference, FIG. 23 is a schematic layout diagram illustrating a semiconductor memory device according to some embodiments. FIG. 24 is a plan view of the cell region of FIG. 23. FIG. 25 is a cross-sectional view taken along lines E-E and F-F of FIG. 24. FIG. 26 is a cross-sectional view taken along lines G-G and H-H of FIG. 24. FIG. 27 is an enlarged view of portion S of FIG. 25. FIG. 28 is a diagram illustrating a shape of the bit lines of FIG. 24 routed in a peripheral region.

The semiconductor memory device according to embodiments of the present disclosure may include memory cells including a vertical channel transistor VCT.

Referring to FIGS. 23 to 28, the semiconductor memory device according to some embodiments may include the peri-gate structure PG_GE, the bit lines BL, word lines WL1 and WL2, channel structures AP_ST, a protruding insulating pattern 275, and data storage patterns DSP.

The peri-gate structure PG_GE may be disposed on the substrate 100. The peri-gate structure PG_GE may be disposed across the cell region 20 and the peripheral region 24. The peri-gate structure PG_GE may be included in a sensing transistor, a transmission transistor, a driving transistor, and the like. The types of transistors disposed in a cell array area and a peripheral circuit area may vary depending on the design arrangement of the semiconductor memory device.

The peri-gate structure PG_GE may include a peri-gate insulating layer 215, a peri-lower conductive pattern 223, and a peri-upper conductive pattern 225. The peri-gate insulating layer 215 may include a silicon oxide layer, a silicon oxynitride layer, a high-k insulating layer having a dielectric constant higher than that of the silicon oxide layer, or a combination thereof. The high-k insulating layer may include, for example, at least one of metal oxide, metal oxynitride, metal silicon oxide, or metal silicon oxynitride, but is not limited thereto.

The peri-lower conductive pattern 223 and the peri-upper conductive pattern 225 may each include a conductive material. For example, the peri-lower conductive pattern 223 and the peri-upper conductive pattern 225 may each include at least one of a doped semiconductor material, conductive metal nitride, conductive metal silicon nitride, metal carbo-nitride, conductive metal silicide, conductive metal oxide, a two-dimensional (2D) material, a metal, or a metal alloy. Although the peri-gate structure PG_GE is illustrated as including a plurality of conductive patterns, it is not limited thereto.

A first peri-lower insulating layer 227 and a second peri-lower insulating layer 228 are disposed on the substrate 100. The first peri-lower insulating layer 227 and the second peri-lower insulating layer 228 may each be made of an insulating material.

The second peri-lower insulating layer 228 is illustrated as being in contact with the sidewall of the peri-lower conductive pattern 223 and the sidewall of the peri-upper conductive pattern 225, but is not limited thereto. The peri-gate structure PG_GE may include a peri-gate spacer disposed on the sidewall of the peri-lower conductive pattern 223 and the sidewall of the peri-upper conductive pattern 225.

A first peri-wiring line 241*a* and a peri-contact plug 241*b* may be disposed in the first peri-lower insulating layer 227 and the second peri-lower insulating layer 228. The first peri-wiring line 241*a* and the peri-contact plug 241*b* are illustrated as being different layers from each other, but they are not limited thereto. A boundary between the first peri-wiring line 241*a* and the peri-contact plug 241*b* may not be distinguished. Each of the first peri-wiring line 241*a* and the peri-contact plug 241*b* includes a conductive material.

A first peri-upper insulating layer 251 and a second peri-upper insulating layer 252 may be disposed on the first peri-wiring line 241*a* and the peri-contact plug 241*b*. The first peri-upper insulating layer 251 and the second peri-upper insulating layer 252 may each be made of an insulating material.

A second peri-wiring line 243 and a peri-via plug 242 may be disposed on the first peri-wiring line 241*a*. The peri-via plug 242 may be disposed in the first peri-upper insulating layer 251. The second peri-wiring line 243 may be disposed in the second peri-upper insulating layer 252.

The second peri-wiring line 243 and the peri-via plug 242 may be connected to the first peri-wiring line 241*a*. The peri-via plug 242 may connect the first peri-wiring line 241*a* to the second peri-wiring line 243. Each of the second peri-wiring line 243 and the peri-via plug 242 includes a conductive material. The second peri-wiring line 243 and the peri-via plug 242 are illustrated as being different layers from each other, but they are not limited thereto. A boundary between the second peri-wiring line 243 and the peri-via plug 242 may not be distinguished.

A third peri-upper insulating layer 253, a fourth peri-upper insulating layer 254, and a fifth peri-upper insulating layer 255 may be sequentially disposed on the second peri-wiring line 243. The third peri-upper insulating layer 253, the fourth peri-upper insulating layer 254, and the fifth peri-upper insulating layer 255 may each be made of an insulating material.

The fourth peri-upper insulating layer 254 may be made of an insulating material different from those of the third peri-upper insulating layer 253 and the fifth peri-upper insulating layer 255. For example, the fourth peri-upper insulating layer 254 may be made of an oxide-based insulating material, and the third peri-upper insulating layer 253 and the fifth peri-upper insulating layer 255 may be made of a nitride-based insulating material, but the present disclosure is not limited thereto.

A cell connection plug 244 may be disposed in the third peri-upper insulating layer 253, the fourth peri-upper insulating layer 454, and the fifth peri-upper insulating layer 255. The cell connection plug 244 may be connected to the second peri-wiring line 243. The cell connection plug 244 includes a conductive material. Unlike the illustrated example, the cell connection plug 244 may be disposed in a peri-upper insulating layer formed of a single layer. That is, the third peri-upper insulating layer 253, the fourth peri-upper insulating layer 254, and the fifth peri-upper insulating layer 255 may be a single insulating layer.

The bit lines BL may be disposed above the peri-gate structure PG_GE. More specifically, the bit lines BL may be disposed on the fifth peri-upper insulating layer 255. For example, the bit lines BL may be in contact with the fifth peri-upper insulating layer 255.

The bit line BL may be elongated in the second direction D2. Adjacent bit lines BL may be spaced apart from each other in the first direction D1. The bit line BL includes a long sidewall extending in the second direction D2 and a short sidewall extending in the first direction D1.

Each bit line BL may be disposed on the cell connection plug 244. Each bit line BL may be connected to the cell connection plug 244. Each bit line BL is illustrated as being a single layer, but is not limited thereto.

In FIG. 28, the bit line BL may include a first head region BL_HR1, a second head region BL_HR2, and a body region BL_BR. The first head region BL_HR1 of the bit line and the second head region BL_HR2 of the bit line may be positioned at the ends of the bit line BL. The first head region BL_HR1 of the bit line and the second head region BL_HR2 of the bit line are spaced apart from each other in the second direction D2.

For example, the first head region BL_HR1 of the bit line and the second head region BL_HR2 of the bit line may be disposed in the peripheral region 24. The body region BL_BR of the bit line may be disposed in the cell region 20.

The first head region BL_HR1 of the bit line and the second head region BL_HR2 of the bit line may each have a balloon shape extending in the second direction D2. In the first head region BL_HR1 of the bit line and the second head region BL_HR2 of the bit line, the width of the bit line BL in the first direction D1 may increase and then decrease as the distance from the body region BL_BR of the bit line increases.

A bit line plug 262 may be disposed on the bit line BL. The bit line plug 262 is connected to the bit line BL. For example, the bit line plug 262 may be connected to the bit line BL in the head regions BL_HR1 and BL_HR2 of the bit line.

The bit line BL may include a first bit line and a second bit line that are closest in the first direction D1. The first head region of the first bit line and the first head region of the second bit line may be arranged in the first direction D1. The second head region of the first bit line and the second head region of the second bit line may be arranged in the first direction D1. For example, the bit line plug 262 may be connected to the bit line BL in the first head region of the first bit line. However, the bit line plug 262 may not be connected to the bit line BL in the first head region of the second bit line. The bit line plug 262 may be connected to the bit line BL in the second head region of the second bit line.

Unlike the illustrated example, the bit line plug 262 may be connected to the bit line BL in the first head region of the second bit line.

A cell lower insulating layer 271 may be disposed on the fifth peri-upper insulating layer 255. The cell lower insulating layer 271 is disposed between the bit lines BL spaced apart in the first direction D1. The cell lower insulating layer 271 may be made of an insulating material.

The protruding insulating pattern 275 may be disposed above the bit line BL and the cell lower insulating layer 271. A cell lower etch stop layer 273 may be disposed between the protruding insulating pattern 275 and the cell lower insulating layer 271.

Each of the protruding insulating pattern 275 and the cell lower etch stop layer 273 may be made of an insulating material. The cell lower etch stop layer 273 may include a material having an etch selectivity with respect to the protruding insulating pattern 275. For example, the protruding insulating pattern 275 may be made of an oxide-based insulating material including silicon, but is not limited thereto. Unlike the illustrated example, the cell lower etch stop layer 273 may not be disposed between the protruding insulating pattern 275 and the cell lower insulating layer 271.

The protruding insulating pattern 275 may include a plurality of channel trenches CH_T. Each channel trench CH_T may be elongated in the first direction D1. Adjacent channel trenches CH_T may be spaced apart from each other in the second direction D2. Each channel trench CH_T may intersect the bit line BL. One channel trench CH_T may expose the plurality of bit lines BL adjacent in the first direction D1.

The bottom surface of each channel trench CH_T may be defined by the bit line BL and the cell lower insulating layer 271. The sidewall of each channel trench CH_T may be defined by the protruding insulating pattern 275 and the cell lower etch stop layer 273. At least a part of the sidewall of the channel trench CH_T may be a sidewall 275SW of the protruding insulating pattern. When the cell lower etch stop layer 273 is not provided, the sidewall of each channel trench CH_T may be defined by the protruding insulating pattern 275.

The channel structure AP_ST may be disposed on each bit line BL. The plurality of channel structures AP_ST may be connected to one bit line BL. The plurality of channel structures AP_ST disposed on one bit line BL are spaced apart from each other in the second direction D2.

The channel structure AP_ST may be disposed in the channel trench CH_T extending in the first direction D1. The plurality of channel structures AP_ST may be disposed in one channel trench CH_T. The plurality of channel structures AP_ST disposed in the channel trench CH_T are spaced apart from each other in the first direction D1.

For example, the channel structures AP_ST may be two-dimensionally arranged along the first and second directions D1 and D2 intersecting each other.

The channel structure AP_ST may extend along the sidewall and the bottom surface of the channel trench CH_T. In the semiconductor memory device according to some embodiments, the channel structure AP_ST may have a "U" shape in a cross section taken in the second direction D2.

The channel structure AP_ST may include a horizontal portion AP_STH, a first vertical portion AP_STV1, and a second vertical portion AP_STV2. The first vertical portion AP_STV1 of the channel structure and the second vertical portion AP_STV2 of the channel structure may protrude from the horizontal portion AP_STH of the channel structure in the third direction D3.

The horizontal portion AP_STH of the channel structure may extend along the bottom surface of the channel trench CH_T. In the cross section taken in the second direction D2, the horizontal portion AP_STH of the channel structure may extend along the upper surface of the bit line BL. The horizontal portion AP_STH of the channel structure is connected to the bit line BL. For example, the horizontal portion AP_STH of the channel structure may be in contact with the upper surface of the bit line BL.

The first vertical portion AP_STV1 of the channel structure and the second vertical portion AP_STV2 of the channel structure may extend along the sidewall of the channel trench CH_T. In the cross section taken in the second direction D2, the first vertical portion AP_STV1 of the channel structure and the second vertical portion AP_STV2 of the channel structure may each extend along the sidewall 275SW of the protruding insulating pattern.

The channel structure AP_ST may include a first channel pattern AP1, a second channel pattern AP2, and a connection channel pattern AP_CP. The connection channel pattern AP_CP connects the first channel pattern AP1 to the second channel pattern AP2. The first channel pattern AP1 and the second channel pattern AP2 are spaced apart from each other in the second direction D2.

The first channel pattern AP1, the second channel pattern AP2, and the connection channel pattern AP_CP may be disposed on the bit line BL. The first channel pattern AP1 and the second channel pattern AP2 are connected to the bit line BL. The first channel pattern AP1 and the second channel pattern AP2 may be in contact with the upper surface of the bit line BL.

The first channel pattern AP1, the second channel pattern AP2, and the connection channel pattern AP_CP may be distinguished with respect to a first word line WL1 and a second word line WL2 to be described later. In FIG. 27, the first word line WL1 will be described as an example. The first word line WL1 may include an inner wall facing the sidewall 275SW of the protruding insulating pattern, and an outer wall opposite to the inner wall in the second direction D2. A boundary between the first channel pattern AP1 and the connection channel pattern AP_CP may be an extension line of the outer wall of the first word line WL1 extending in the third direction D3.

Unlike the illustrated example, the connection channel pattern AP_CP may not be disposed between the first channel pattern AP1 and the second channel pattern AP2. In this case, the first channel pattern AP1 and the second channel pattern AP2 may have an "L" shape.

The channel structure AP_ST may include an oxide semiconductor material. The channel structure AP_ST may include, for example, metal oxide. As an example, the channel structure AP_ST may be an amorphous metal oxide layer. As another example, the channel structure AP_ST may be a polycrystalline metal oxide layer. As still another example, the channel structure AP_ST may be a combination of an amorphous metal oxide layer and a polycrystalline metal oxide layer. As still another example, the channel structure AP_ST may be a c-axis aligned crystalline (CAAC) metal oxide layer.

The channel structure AP_ST may include, for example, one of indium oxide, tin oxide, zinc oxide, In—Zn-based oxide (IZO), Sn—Zn-based oxide, Al—Zn-based oxide, Zn—Mg-based oxide, Sn—Mg-based oxide, In—Mg-based oxide, In—Ga-based oxide (IGO), In—Ga—Zn-based oxide (IGZO), In—Al—Zn-based oxide, In—Sn—Zn-based oxide, Sn—Ga—Zn-based oxide, Al—Ga—Zn-based oxide, Sn—Al—Zn-based oxide, In—Hf—Zn-based oxide, In—La—Zn-based oxide, In—Ce—Zn-based oxide, In—Pr—Zn-based oxide, In—Nd—Zn-based oxide, In—Sm—Zn-based oxide, In—Eu—Zn-based oxide, In—Gd—Zn-based oxide, In—Tb—Zn-based oxide, In—Dy—Zn-based oxide, In—Ho—Zn-based oxide, In—Er—Zn-based oxide, In—Tm—Zn-based oxide, In—Yb—Zn-based oxide, In—Lu—Zn-based oxide, In—Sn—Ga—Zn-based oxide, In—Hf—Ga—Zn-based oxide, In—Al—Ga—Zn-based oxide, In—Sn—Al—Zn-based oxide, In—Sn—Hf—Zn-based oxide, and/or In—Hf—Al—Zn-based oxide, but the present disclosure is not limited thereto. As used herein, the term "In—Ga—Zn-based oxide" refers to oxide containing In, Ga and Zn as its main components and there is no particular limitation on the ratio of In:Ga:Zn.

The first word line WL1 and the second word line WL2 may be disposed on the channel structure AP_ST. The first word line WL1 and the second word line WL2 may be disposed in the channel trench CH_T.

Each of the first word line WL1 and the second word line WL2 may extend in the first direction D1. The first word line WL1 and the second word line WL2 may be alternately arranged in the second direction D2. The first word line WL1 is spaced apart from the second word line WL2 in the second direction D2.

The first word line WL1 and the second word line WL2 are spaced apart from the bit line BL in the third direction D3. The first word line WL1 and the second word line WL2 intersect the bit line BL.

The first word line WL1 and the second word line WL2 are disposed on the horizontal portion AP_STH of the channel structure. The first word line WL1 and the second word line WL2 are disposed between the first vertical portion AP_STV1 of the channel structure and the second vertical portion AP_STV2 of the channel structure.

The first word line WL1 is disposed on the first channel pattern AP1. The second word line WL2 is disposed on the second channel pattern AP2. The first word line WL1 and the second word line WL2 are disposed between the first channel pattern AP1 and the second channel pattern AP2. The first channel pattern AP1 is closer to the first word line WL1 than to the second word line WL2. The second channel pattern AP2 is closer to the second word line WL2 than to the first word line WL1.

Each of the first word line WL1 and the second word line WL2 may have a width in the second direction D2. The width of a portion of the first word line WL1 that overlaps the channel structure AP_ST in the third direction D3 may be different from the width of a portion of the first word line WL1 that does not overlap the channel structure AP_ST. The width of a portion of the second word line WL2 that overlaps the channel structure AP_ST in the third direction D3 may be different from the width of a portion of the second word line WL2 that does not overlap the channel structure AP_ST.

For example, each of the first word line WL1 and the second word line WL2 may include a first portion WLa of the word line and a second portion WLb of the word line. The width of the first portion WLa of the word line in the second direction D2 may be smaller than the width of the second portion WLb of the word line in the second direction D2. As an example, the first portion WLa of the word line may be disposed on the channel structure AP_ST. The first portion WLa of the word line may be disposed on the first channel pattern AP1 and the second channel pattern AP2.

Each of the first word line WL1 and the second word line WL2 may include the first portion WLa of the word line and the second portion WLb of the word line that are alternately disposed along the first direction D1. Each of the channel structures AP_ST may be disposed between the second portions WLb of the word lines adjacent in the first direction D1. In the first word line WL1, each of the first channel patterns AP1 may be disposed between the second portions WLb of the word lines adjacent in the first direction D1. In the second word line WL2, each of the second channel patterns AP2 may be disposed between the second portions WLb of the word lines adjacent in the first direction D1.

The channel structure AP_ST is not disposed below the second portion WLb of the word line. The height of the first portion WLa of the word line is smaller than the height of the second portion WLb of the word line. For example, a height difference between the first portion WLa of the word line and the second portion WLb of the word line may be equal to the thickness of the channel structure AP_ST.

The first and second word lines WL1 and WL2 may include a conductive material, and may include, for example, at least one of doped polysilicon, conductive metal nitride, conductive metal silicon nitride, metal carbonitride, conductive metal silicide, conductive metal oxide, a two-dimensional material, metal or a metal alloy.

With respect to the upper surface of the bit line BL, upper surfaces WL_US of the first and second word lines WL1 and WL2 may be higher than uppermost parts AP_UUS of the vertical portions AP_STV1 and AP_STV2 of the channel structure. The uppermost parts of the channel patterns AP1 and AP2 may be the uppermost parts AP_UUS of the vertical portions AP_STV1 and AP_STV2 of the channel structure. A height H1 from the upper surface of the bit line BL to the uppermost parts AP_UUS of the vertical portions AP_STV1 and AP_STV2 of the channel structure may be smaller than a height H2 from the upper surface of the bit line BL to the upper surfaces WL_US the first and second word lines WL1 and WL2.

A gate insulating layer GOX may be disposed between the first word line WL1 and the channel structure AP_ST and between the second word line WL2 and the channel structure AP_ST. The gate insulating layer GOX may be disposed between the first word line WL1 and the first channel pattern AP1 and between the second word line WL2 and the second channel pattern AP2. The gate insulating layer GOX may extend in the first direction D1 in parallel to the first word line WL1 and the second word line WL2.

The gate insulating layer GOX may extend along the first vertical portion AP_STV1 of the channel structure. The gate insulating layer GOX may extend along the second vertical portion AP_STV2 of the channel structure. In cross-sectional view, it is illustrated that the gate insulating layer GOX between the first word line WL1 and the channel structure AP_ST is separated from the gate insulating layer GOX between the second word line WL2 and the channel structure AP_ST, but the present disclosure is not limited thereto.

The gate insulating layer GOX may include a silicon oxide layer, a silicon oxynitride layer, a high-k insulating layer having a dielectric constant higher than that of the silicon oxide layer, or a combination thereof.

A part of the gate insulating layer GOX may protrude in the third direction D3 beyond the upper surfaces WL_US of the first and second word lines WL1 and WL2. A part of the gate insulating layer GOX may protrude in the third direction D3 beyond the uppermost parts AP_UUS of the vertical portions AP_STV1 and AP_STV2 of the channel structure.

A height H4 from the upper surface of the bit line BL to an uppermost part GOX_UUS of the gate insulating layer may be greater than the height H1 from the upper surface of the bit line BL to the uppermost parts AP_UUS of the vertical portions AP_STV1 and AP_STV2 of the channel structure. The height H4 from the upper surface of the bit line BL to the uppermost part GOX_UUS of the gate insulating layer may be greater than the height H2 from the upper surface of the bit line BL to the upper surfaces WL_US of the word lines WL1 and WL2.

A gate isolation pattern GSS may be disposed on the bit line BL and the cell lower insulating layer 271. The gate isolation pattern GSS may be disposed in the channel trench CH_T. The gate isolation pattern GSS may be disposed on the channel structure AP_ST, the first word line WL1, and the second word line WL2.

The gate isolation pattern GSS may be disposed between the first word line WL1 and the second word line WL2 adjacent in the second direction D2. The first word line WL1 and the second word line WL2 may be separated by the gate isolation pattern GSS. The gate isolation pattern GSS may extend in the first direction D1 between the first word line WL1 and the second word line WL2.

The first word line WL1 may be disposed between the gate isolation pattern GSS and the channel structure AP_ST. The second word line WL2 may be disposed between the gate isolation pattern GSS and the channel structure AP_ST. The first word line WL1 may be disposed between the gate isolation pattern GSS and the first channel pattern AP1. The second word line WL2 may be disposed between the gate isolation pattern GSS and the second channel pattern AP2.

The gate isolation pattern GSS may include a horizontal portion and a protruding portion. The protruding portion of the gate isolation pattern GSS may protrude from the horizontal portion of the gate isolation pattern GSS toward the bit line BL in the third direction D3. The protruding portion of the gate isolation pattern GSS may be closer to the bit line BL than the horizontal portion of the gate isolation pattern GSS. The horizontal portion of the gate isolation pattern GSS may be disposed on the upper surfaces WL_US of the first and second word lines WL1 and WL2. In cross-sectional view, the gate isolation pattern GSS may have a “T” shape.

The gate isolation pattern GSS may include a gate isolation liner 236, a gate isolation filling layer 237, and a gate isolation capping layer 238. The gate isolation liner 236 may extend along the upper surfaces WL_US of the first and second word lines WL1 and WL2 and along the outer walls of the first and second word lines WL1 and WL2. The gate isolation liner 236 may extend along the horizontal portion AP_STH of the channel structure. The gate isolation liner 236 may be in contact with the connection channel pattern AP_CP. The gate isolation liner 236 may extend along the gate insulating layer GOX protruding beyond the upper surfaces WL_US of the first and second word lines WL1 and WL2. The gate isolation liner 236 may be in contact with the side surface of the gate insulating layer GOX. Unlike the illustrated example, the gate isolation liner 236 may not extend along the gate insulating layer GOX protruding beyond the upper surfaces WL_US of the first and second word lines WL1 and WL2.

The gate isolation filling layer 237 may be disposed on the gate isolation liner 236. The gate isolation capping layer 238 may be disposed on the gate isolation filling layer 237. The gate isolation liner 236, the gate isolation filling layer 237, and the gate isolation capping layer 238 may each be made of an insulating material. Unlike the illustrated example, the gate isolation pattern GSS may be a single layer.

With respect to the upper surface of the bit line BL, an upper surface GSS_US of the gate isolation pattern may be disposed at the same height as the upper surface of the protruding insulating pattern 275, but the present disclosure is not limited thereto.

A height H3 from the upper surface of the bit line BL to the upper surface GSS_US of the gate isolation pattern may be greater than the height H1 from the upper surface of the bit line BL to the uppermost parts AP_UUS of the vertical portions AP_STV1 and AP_STV2 of the channel structure. The height H3 from the upper surface of the bit line BL to the upper surface GSS_US of the gate isolation pattern may be greater than the height H2 from the upper surface of the bit line BL to the upper surfaces WL_US of the word lines WL1 and WL2.

The height H3 from the upper surface of the bit line BL to the upper surface GSS_US of the gate isolation pattern is shown to be the same as the height H4 from the upper surface of the bit line BL to the uppermost part GOX_UUS of the gate insulating layer, but the present disclosure is not limited thereto.

The landing pads LP may be disposed on the channel structure AP_ST. The landing pads LP are connected to the first vertical portion AP_STV1 of the channel structure and the second vertical portion AP_STV2 of the channel structure.

The landing pads LP may be disposed on the first channel pattern AP1 and the second channel pattern AP2. The landing pads LP are connected to the first channel pattern AP1 and the second channel pattern AP2.

In plan view, the landing pads LP may have various shapes such as a circle, an ellipse, a rectangle, a square, a rhombus, and a hexagon. In plan view, the landing pads LP may be arranged in a matrix form along the first direction D1 and the second direction D2.

The landing pad LP may include a horizontal portion LP_H and a protruding portion LP_P. The horizontal portion LP_H of the landing pad may be disposed on the upper surface of the protruding insulating pattern 275 and the upper surface GSS_US of the gate isolation pattern. The protruding portion LP_P of the landing pad may protrude from the horizontal portion LP_H of the landing pad toward the bit line BL in the third direction D3.

With respect to the upper surface of the bit line BL, the lowermost part of the landing pattern LP may be lower than the upper surface GSS_US of the gate isolation pattern. In other words, the protruding portion LP_P of the landing pad is disposed between the protruding insulating pattern 275 and the gate isolation pattern GSS. The height from the upper surface of the bit line BL to the lowermost part of the landing pattern LP may be smaller than the height H4 from the upper surface of the bit line BL to the uppermost part GOX_UUS of the gate insulating layer.

Pad separation insulating patterns 235 may be disposed between the landing pads LP. In plan view, the landing pads LP may be arranged in a matrix form along the first direction D1 and the second direction D2. The upper surface of the landing pad LP may be on the same plane as the upper surface of the pad separation insulating pattern 235, but the present disclosure is not limited thereto.

The landing pad LP includes a conductive material. The pad separation insulating pattern 235 may include a nitride-based insulating material containing silicon, but is not limited thereto.

The cell upper etch stop layer 295 may be disposed on the landing pad LP and the pad separation insulating pattern 235. The cell upper etch stop layer 295 may extend along the upper surface of the pad separation insulating pattern 235 and a part of the upper surface of the landing pad LP.

The data storage patterns DSP may be respectively disposed on the landing pads LP. As shown in FIG. 24, the data storage patterns DSP may be arranged in a matrix form along the first direction D1 and the second direction D2. The data storage patterns DSP may completely overlap or partially overlap the landing pads LP in the third direction D3. The data storage patterns DSP may be in contact with all or part of the upper surfaces of the landing pads LP.

In concluding the detailed description, those skilled in the art will appreciate that many variations and modifications may be made to the preferred embodiments without substantially departing from the principles of the present inventive concept. Therefore, the disclosed preferred embodiments of the invention are used in a generic and descriptive sense only and not for purposes of limitation.

What is claimed is:

1. A semiconductor memory device comprising:

a substrate comprising a cell region and a peripheral region;

a cell region isolation layer that separates the cell region from the peripheral region; and a plurality of cell gate structures on the cell region of the substrate, each of the plurality of cell gate structures comprising a cell gate electrode that extends in a first direction, wherein the cell region of the substrate comprises a plurality of active areas that extend in a second direction different from the first direction, wherein the plurality of active areas are between the cell region isolation layer and a cell element isolation layer and between respective portions of the cell element isolation layer, wherein each of the plurality of active areas comprises a first portion and a second portion separated by one of the plurality of cell gate structures, wherein the second portion of a respective one of the plurality of active areas is on both sides of a respective one of the first portion of the plurality of active areas, wherein ones of the plurality of active areas are in a normal active area or a dummy active area, wherein a width of a first portion of the dummy active area in the first direction is greater than a width of a first portion of the normal active area in the first direction, wherein the plurality of cell gate structures comprises a head region at an end of the plurality of cell gate structures and a body region that extends from the head region in the first direction, wherein a width of the head region of the plurality of cell gate structures in a third direction perpendicular to the first direction increases from an end of the head region to a middle portion of the head region and the width of the head region decreases from the middle portion of the head region to the body region of the plurality of cell gate structures, and wherein at least a portion of the head region of the plurality of cell gate structures overlaps the respective one of the plurality of active areas and the cell element isolation layer in a direction perpendicular to the substrate.

2. The semiconductor memory device of claim 1, wherein the second portion of the plurality of active areas comprises a second upper portion of the plurality of active areas and a second lower portion of the plurality of active areas, and wherein a width of a second lower portion of the dummy active area in the first direction is greater than a width of a second lower portion of the normal active area in the first direction.

3. The semiconductor memory device of claim 1, wherein the dummy active area comprises a first dummy active area and a second dummy active area, and wherein in plan view, the first dummy active area is separated from the second dummy active area.

4. The semiconductor memory device of claim 1, wherein the plurality of cell gate structures comprises a cell gate insulating layer, and a cell gate trench that extends in the first direction, wherein the cell gate electrode is on the cell gate insulating layer, and wherein a thickness of the cell gate insulating layer between the normal active area and the cell gate electrode is less than or equal to a thickness of the cell gate insulating layer between the dummy active area and the cell gate electrode.

5. The semiconductor memory device of claim 4, wherein the cell gate insulating layer comprises a silicon oxide layer, and wherein a thickness of the silicon oxide layer between the normal active area and the cell gate electrode is less than or equal to a thickness of the silicon oxide layer between the dummy active area and the cell gate electrode.

6. The semiconductor memory device of claim 1, further comprising:

a cell conductive line on the substrate, wherein the cell conductive line extends in the third direction and intersects the normal active area.

7. The semiconductor memory device of claim 6, further comprising:

a dummy cell conductive line on the substrate, wherein the dummy cell conductive line extends in the third direction and intersects the dummy active area.

8. The semiconductor memory device of claim 1, wherein the head region of the plurality of cell gate structures completely overlaps the plurality of active areas and the cell element isolation layer in a direction perpendicular to the substrate.

9. The semiconductor memory device of claim 8, wherein the cell region includes a first boundary surface that extends in the first direction and a second boundary surface that extends in the third direction, and wherein the dummy active area is on the second boundary surface of the cell region.

10. A semiconductor memory device comprising:

a substrate comprising a cell region and a peripheral region;

a cell region isolation layer that separates the cell region from the peripheral region;

a plurality of cell gate structures on the cell region of the substrate, each of the plurality of cell gate structures comprising a cell gate electrode that extends in a first direction; and a cell gate plug on the cell gate electrode and electrically connected to the cell gate electrode, wherein the cell region of the substrate comprises a plurality of active areas that extend in a second direction different from the first direction, wherein the plurality of active areas are between the cell region isolation layer and a cell element isolation layer and between respective portions of the cell element isolation layer, wherein ones of the plurality of active areas are in a normal active area or a dummy active area that is in contact with the cell region isolation layer, wherein the plurality of cell gate structures comprises a first head region and a second head region at opposite ends of the plurality of cell gate structures, and a body region between the first head region and the second head region, wherein the body region extends in the first direction, wherein a width of the first head region of the plurality of cell gate structures in a third direction perpendicular to the first direction increases from an end of the first head region opposite the body region to a middle portion of the head region and the width of the first head region decreases from the middle portion of the head region to the body region of the plurality of cell gate structures, wherein the first head region of the plurality of cell gate structures completely overlaps the plurality of active areas and the cell element isolation layer in a direction perpendicular to the substrate, wherein the plurality of cell gate structures comprises a first cell gate structure and a second cell gate structure, wherein the cell gate plug is electrically connected to the cell gate electrode in a first head region of the first cell gate structure, and wherein the cell gate plug is spaced apart from the cell gate electrode in a first head region of the second cell gate structure.

11. The semiconductor memory device of claim 10, wherein each of the plurality of active areas comprises a first portion and a second portion separated by one of the plurality of cell gate structures, wherein the second portion of a respective one of the plurality of active areas is on both sides of a respective one of the first portion of the plurality of active areas, and wherein a width of a first portion of the dummy active area in the first direction is greater than a width of a first portion of the normal active area in the first direction.

12. The semiconductor memory device of claim 11, wherein the second portion of the plurality of active areas comprises a second upper portion of the plurality of active areas and a second lower portion of the plurality of active areas, and wherein a width of a second lower portion of the dummy active area in the first direction is different from a width of a second upper portion of the dummy active area in the first direction.

13. The semiconductor memory device of claim 10, wherein a width of the dummy active area in the first direction in a region intersecting the cell gate electrode is greater than a width of the normal active area in the first direction in a region intersecting the cell gate electrode.

14. The semiconductor memory device of claim 10, wherein the plurality of cell gate structures comprises a cell gate insulating layer, and a cell gate trench that extends in the first direction, wherein the cell gate electrode is on the cell gate insulating layer, and wherein a thickness of the cell gate insulating layer between the normal active area and the cell gate electrode is less than or equal to a thickness of the cell gate insulating layer between the dummy active area and the cell gate electrode.

15. A semiconductor memory device comprising:

a substrate comprising a cell region and a peripheral region;

a cell region isolation layer that separates the cell region from the peripheral region; and a plurality of cell gate structures on the cell region of the substrate, each of the plurality of cell gate structures comprising a cell gate electrode that extends in a first direction, wherein the cell region of the substrate comprises a plurality of active areas that extend in a second direction different from the first direction, wherein the plurality of active areas are between a respective cell element isolation layer and the cell region isolation layer, wherein the plurality of active areas comprises a normal active area and a dummy active area in contact with the cell region isolation layer, wherein the plurality of cell gate structures comprises a head region at an end of the plurality of cell gate structures and a body region extending from the head region in the first direction, wherein a width of the head region of the plurality of cell gate structures in a third direction perpendicular to the first direction increases from an end of the head region to a middle portion of the head region and the width of the head region decreases from the middle portion of the head region to the body region of the plurality of cell gate structures, wherein at least a portion of the head region of the plurality of cell gate structures overlaps the plurality of active areas and the cell element isolation layer in a direction perpendicular to the substrate, and wherein a width of the dummy active area in the first direction in a region overlapping the cell gate electrode is greater than a width of the normal active area in the first direction in a region overlapping the cell gate electrode.

16. The semiconductor memory device of claim 15, wherein the plurality of cell gate structures comprises a cell gate insulating layer below the cell gate electrode, and wherein a thickness of the cell gate insulating layer between the normal active area and the cell gate electrode is less than a thickness of the cell gate insulating layer between the dummy active area and the cell gate electrode.

17. The semiconductor memory device of claim 15, wherein the plurality of cell gate structures comprises a cell gate insulating layer below the cell gate electrode, and wherein a thickness of the cell gate insulating layer between the normal active area and the cell gate electrode is equal to a thickness of the cell gate insulating layer between the dummy active area and the cell gate electrode.

18. The semiconductor memory device of claim 15, wherein a height from the normal active area to an upper surface of one of the plurality of cell gate structures is different from a height from the dummy active area to the upper surface of the cell gate structure.

19. The semiconductor memory device of claim 15, wherein a height from the normal active area to an upper surface of one of the plurality of cell gate structures is equal to a height from the dummy active area to the upper surface of the cell gate structure.

20. The semiconductor memory device of claim 15, wherein each of the plurality of active areas comprises a first portion and a second portion separated by one of the plurality of cell gate structures, wherein the second portion of a respective one of the plurality of active areas is on both sides of a respective one of the first portion of the plurality of active areas, and wherein a width of a first portion of the dummy active area in the first direction is greater than a width of a first portion of the normal active area in the first direction.

* * * * *